United States Patent [19]
Matsugu et al.

[11] Patent Number: 5,294,980
[45] Date of Patent: Mar. 15, 1994

[54] POSITIONING DETECTING METHOD AND APPARATUS

[75] Inventors: Masakazu Matsugu, Atsugi; Kenji Saitoh, Yokohama; Yukichi Niwa, Narashino; Noriyuki Nose, Machida; Ryo Kuroda, Atsugi; Shigeyuki Suda, Yokohama, all of Japan

[73] Assignee: Canon Kabushiki Kaisha, Tokyo, Japan

[21] Appl. No.: 58,662

[22] Filed: May 10, 1993

Related U.S. Application Data

[63] Continuation-in-part of Ser. No. 875,583, Apr. 28, 1992, abandoned, which is a continuation of Ser. No. 798,048, Nov. 27, 1991, abandoned, which is a continuation of Ser. No. 327,705, Mar. 23, 1989, abandoned.

[30] Foreign Application Priority Data

Mar. 24, 1988 [JP] Japan .................. 63-070494

[51] Int. Cl.⁵ .................. G01B 11/00; G01N 21/85
[52] U.S. Cl. .................. 356/401; 250/548
[58] Field of Search .................. 356/372, 375, 399–401, 356/363; 359/233, 900; 355/43, 53, 68, 77, 55, 67; 250/548, 557, 237 G

[56] References Cited

U.S. PATENT DOCUMENTS

| | | |
|---|---|---|
| 4,037,969 | 7/1977 | Feldman et al. .................. 356/400 |
| 4,265,542 | 5/1981 | Snow . |
| 4,311,389 | 1/1982 | Fay et al. .................. 356/400 |
| 4,326,805 | 4/1982 | Feldman et al. . |
| 4,360,273 | 11/1982 | Thaxter . |
| 4,398,824 | 8/1983 | Feldman et al. . |
| 4,545,683 | 10/1985 | Markle .................. 356/401 |
| 4,662,753 | 5/1987 | Yabu . |
| 4,694,186 | 9/1987 | Onoda et al. . |
| 4,728,193 | 3/1988 | Bartelt et al. . |
| 4,815,854 | 3/1989 | Tanaka et al. .................. 356/363 |
| 5,114,235 | 5/1995 | Suda et al. .................. 250/237 G |

FOREIGN PATENT DOCUMENTS

| | | |
|---|---|---|
| 0100526 | 2/1984 | European Pat. Off. . |
| 0336537 | 10/1989 | European Pat. Off. . |
| 3727453 | 3/1988 | Fed. Rep. of Germany . |
| 56-157033 | 12/1981 | Japan . |
| 61-278136 | 12/1986 | Japan . |
| 0001504 | 2/1988 | Japan .................. 356/363 |
| 2073950A | 10/1981 | United Kingdom . |

OTHER PUBLICATIONS

"Application of zone plates to alignment in x-ray lithography", Feldman, et al, Optical Engineering, vol. 22, Mar./Apr. (1983), pp. 203–207.
"A Dual Grating Alignment Technique For X-Ray Lithography", Kinoshita, et al., J. Vac. Sci Technol. B1(4), Oct.-Dec. 1983, pp. 1276–1279.
"Optical-Heterodyne Detection of Mask-To-Wafer Displac. For Fine Align.", Itoh, et al., Japanese Journal of Applied Physics. vol. 25, No. 8, Aug. 1986, pp. L684–L686.

Primary Examiner—Richard A. Rosenberger
Assistant Examiner—Hoa Q. Pham
Attorney, Agent, or Firm—Fitzpatrick, Cella, Harper & Scinto

[57] ABSTRACT

A device for detecting a relative positional relationship between first and second objects with respect to a predetermined direction includes an illumination system for irradiating the first object with light, wherein the first and second objects are provided with first and second physical optic elements, respectively, each having a light converging or diverging function in at least one direction and wherein the illumination system illuminates the first physical optic element. A photodetecting system detects light passing through the first object and emanating from the second object, and is operable to detect light convergently or divergently influenced by both of the first and physical optic elements, such that the relative positional relationship between the first and second objects can be detected on the basis of the detection by the photodetecting system. At least one of the first and second physical optic elements has a light converging or diverging function in a direction perpendicular to the one direction and has different focal lengths in the perpendicular direction and in the one direction.

110 Claims, 17 Drawing Sheets

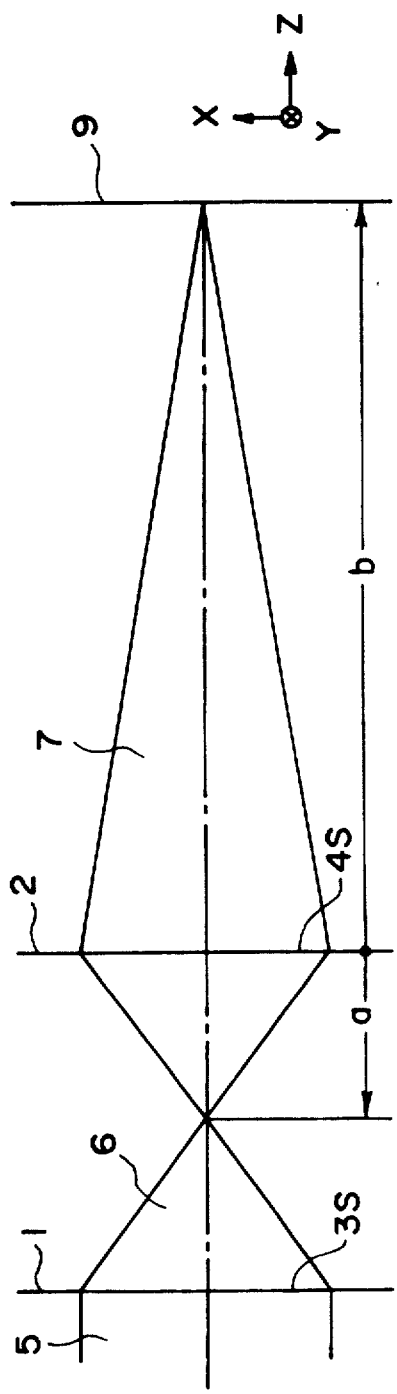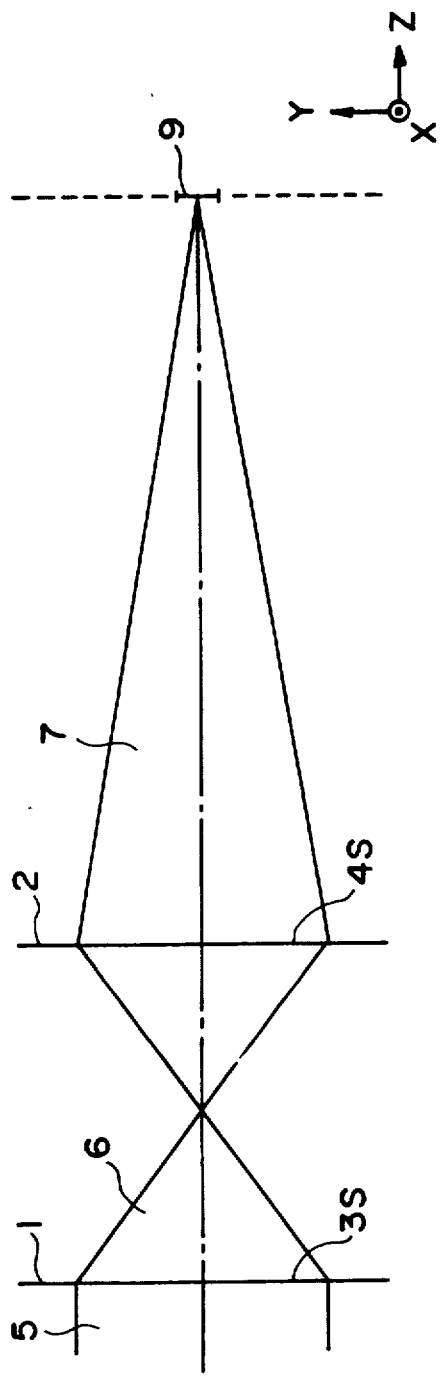
FIG. 3A
FIG. 3B

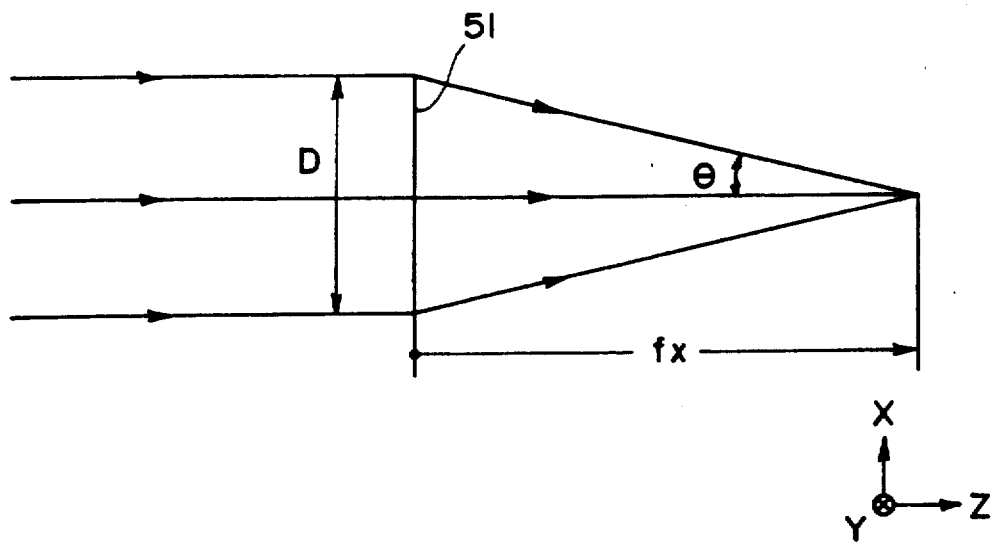
F I G. 6A
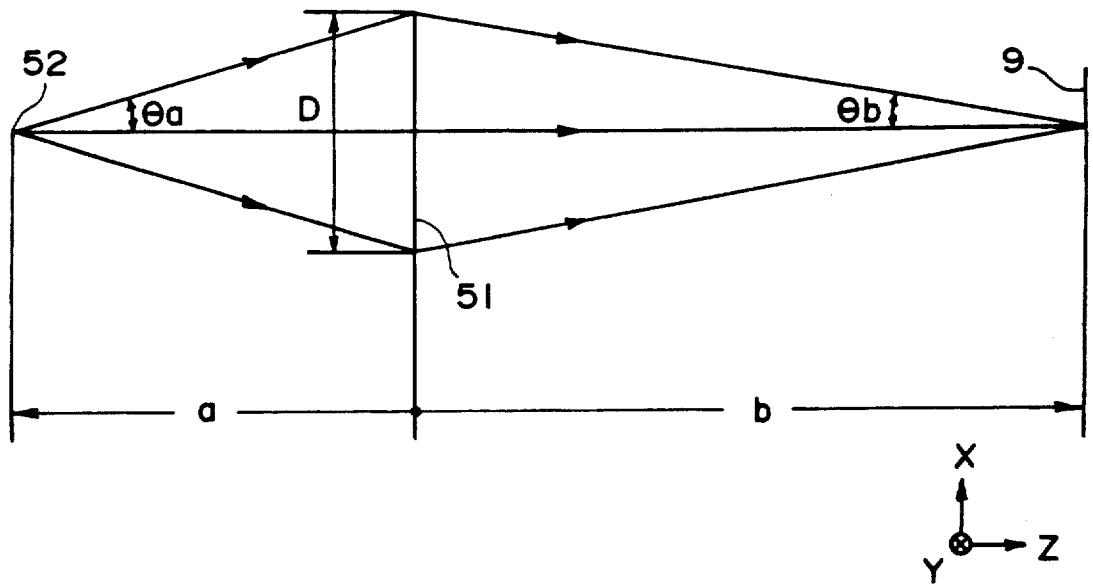
F I G. 6B

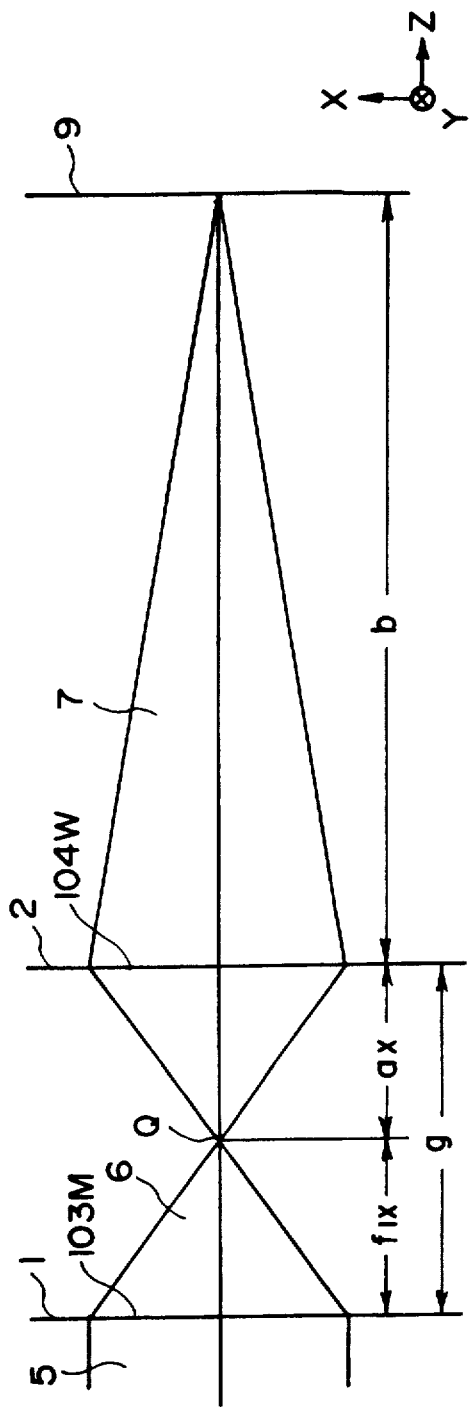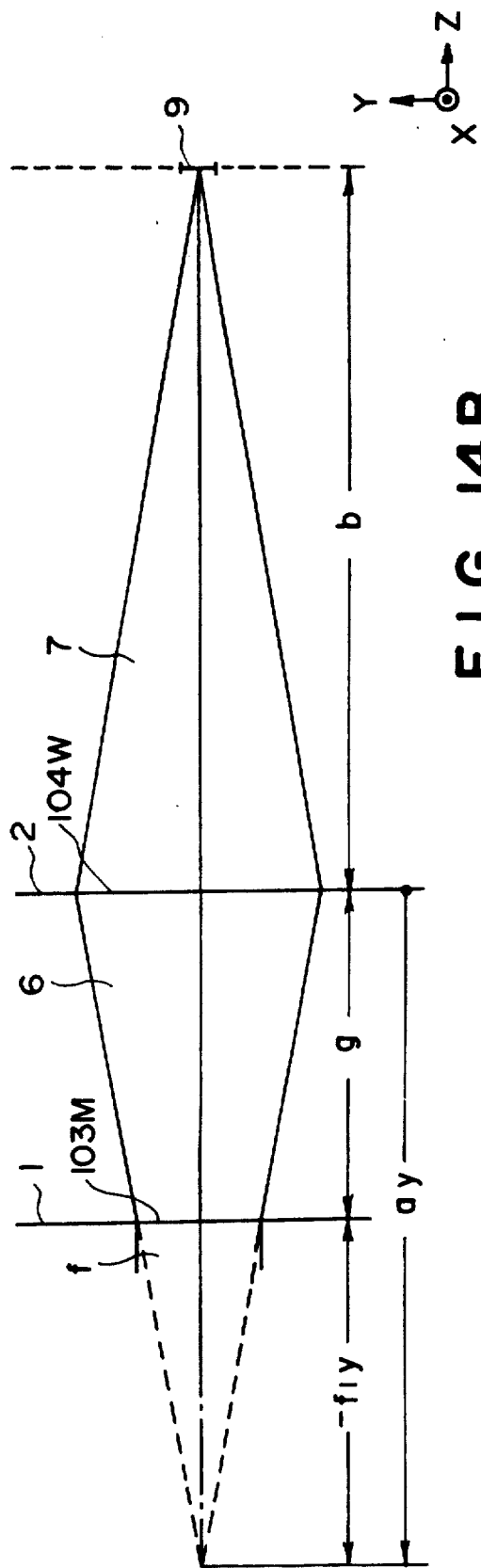
FIG. 14A
FIG. 14B

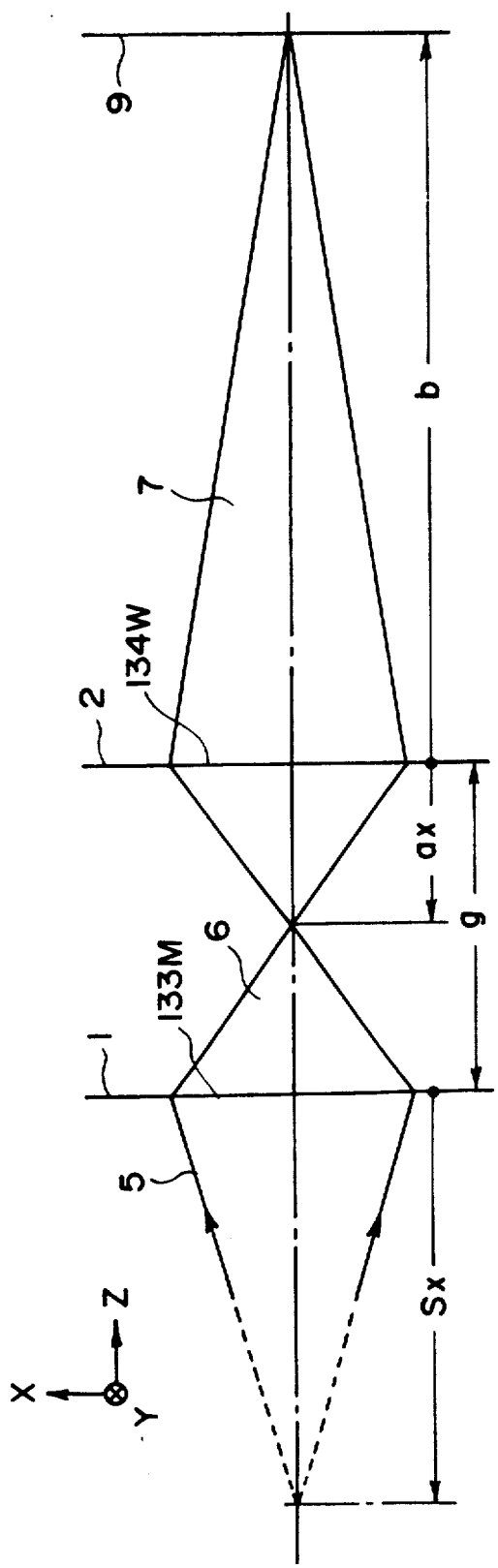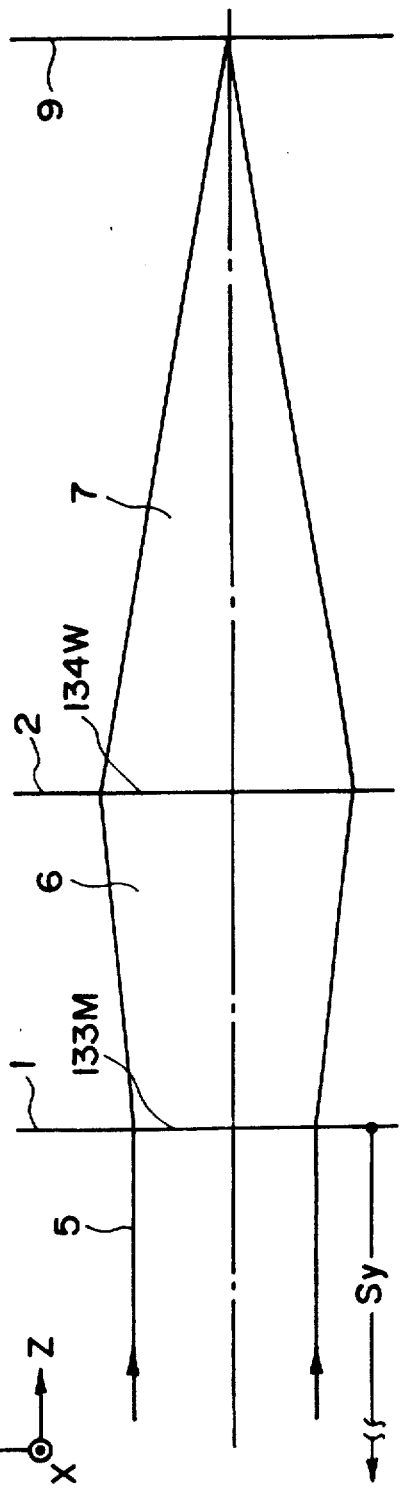
FIG. 17A
FIG. 17B

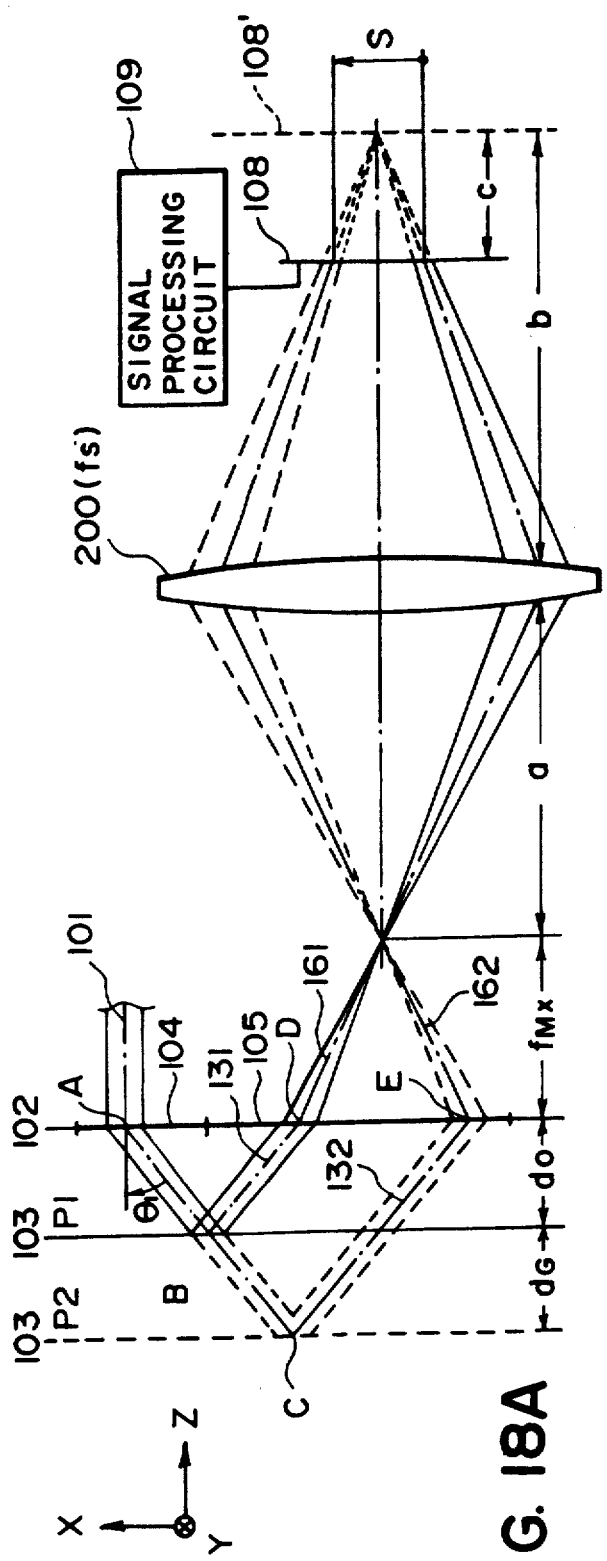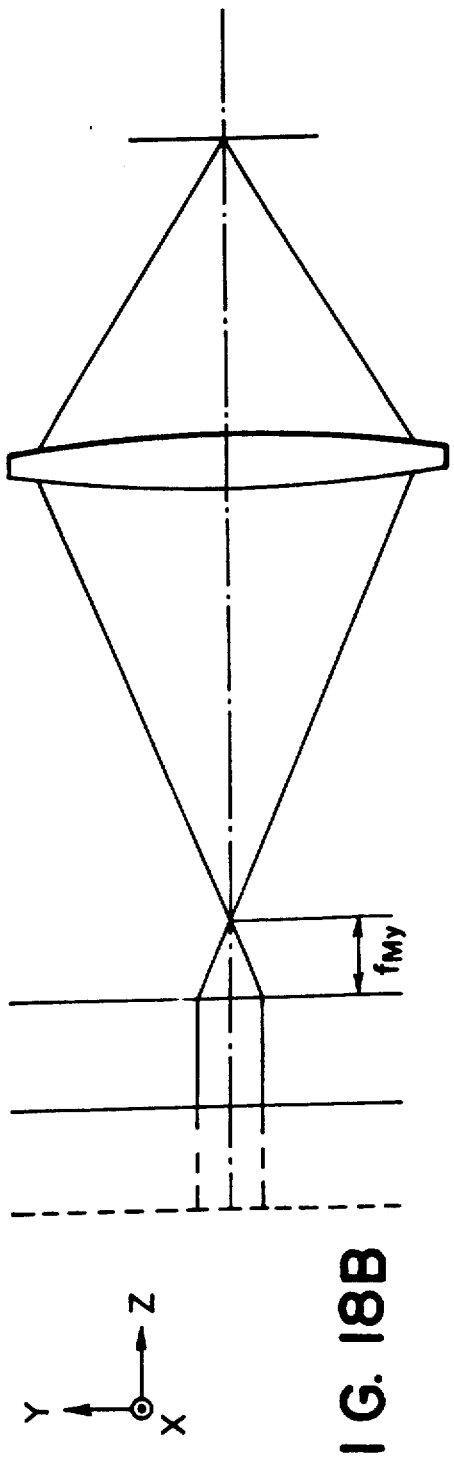
FIG. 18A
FIG. 18B

POSITIONING DETECTING METHOD AND APPARATUS

This application is a continuation-in-part of application Ser. No. 07/875,583 filed Apr. 28, 1992, now abandoned, which is a continuation of application Ser. No. 07/798,048, filed Nov. 27, 1991, now abandoned, which is a continuation of application Ser. No. 07/327,705, filed Mar. 23, 1989, now abandoned.

FIELD OF THE INVENTION AND RELATED ART

This invention relates generally to a system for correctly positioning an object. More particularly, the invention is concerned with a position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

When in the illustrated alignment system the amount of relative positional deviation is to be determined, the lights from the zone plates provided on the mask and the wafer are independently imaged upon a predetermined plane at which the evaluation should be made, and the amount of deviation of each imaged light from a corresponding reference position is detected.

SUMMARY OF THE INVENTION

It is a primary object of the present invention to provide an improved position detection method and apparatus.

It is another object of the present invention to provide a position detecting method and apparatus which enables detection of a relative position of two objects with respect to a predetermined direction on the basis of a light signal having a large sensitivity to any relative positional deviation of the two objects in the predetermined direction but having no or small sensitivity to any relative positional deviation of the two objects in a direction perpendicular to the predetermined direction.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A and 3B and FIGS. 4A and 4B are schematic representations, respectively, for explicating the principle of position detection using different types of zone plates, for example.

FIGS. 6A and 6B are schematic representations, respectively, for explicating a zone plate usable in the present invention.

FIGS. 14A and 14B are schematic representations, respectively, for explicating an eighth embodiment of the present invention.

FIGS. 17A and 17B are schematic representations, respectively, for explicating an eleventh embodiment of the present invention.

FIGS. 18A and 18B are schematic representations, respectively, showing an optical arrangement of a gap measuring system according to a twelfth embodiment of the present invention.

DESCRIPTION OF THE PREFERRED EMBODIMENTS

Figure 1:
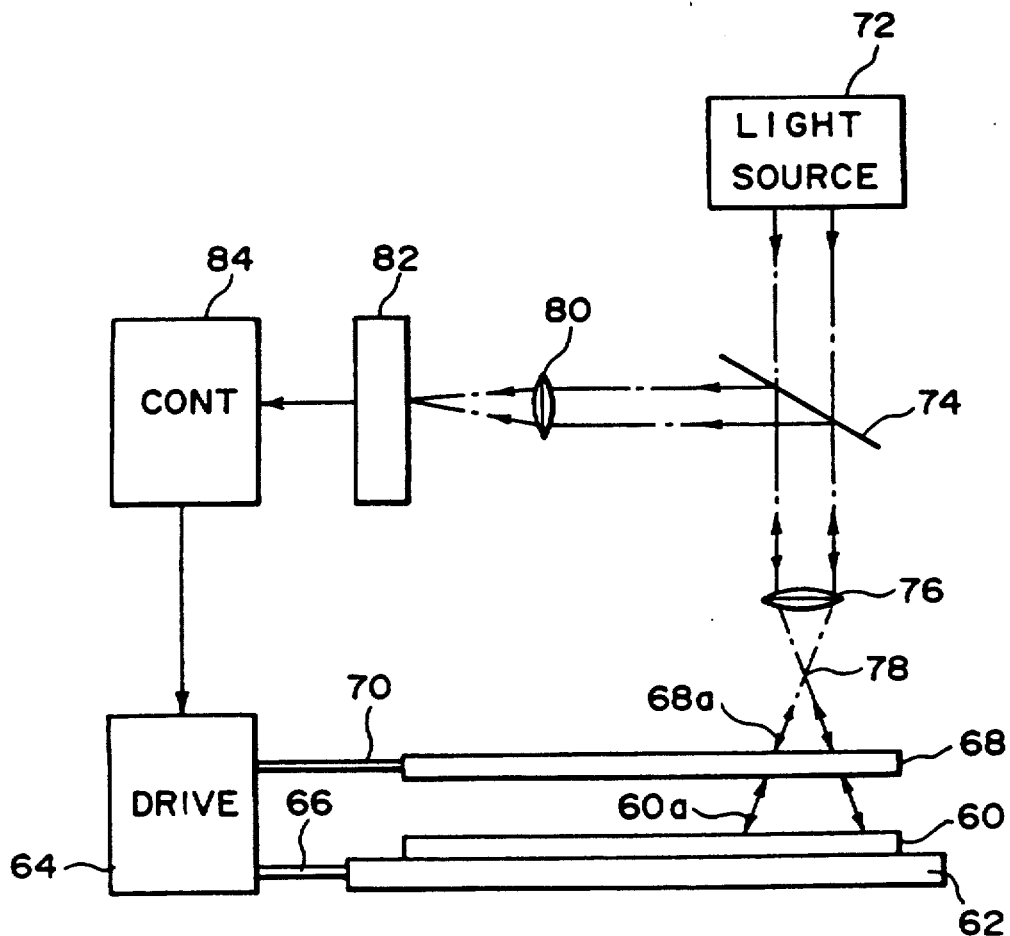
FIGS. 1 and 2 are schematic views for explicating a known type alignment system using zone plates.
Figure 2:
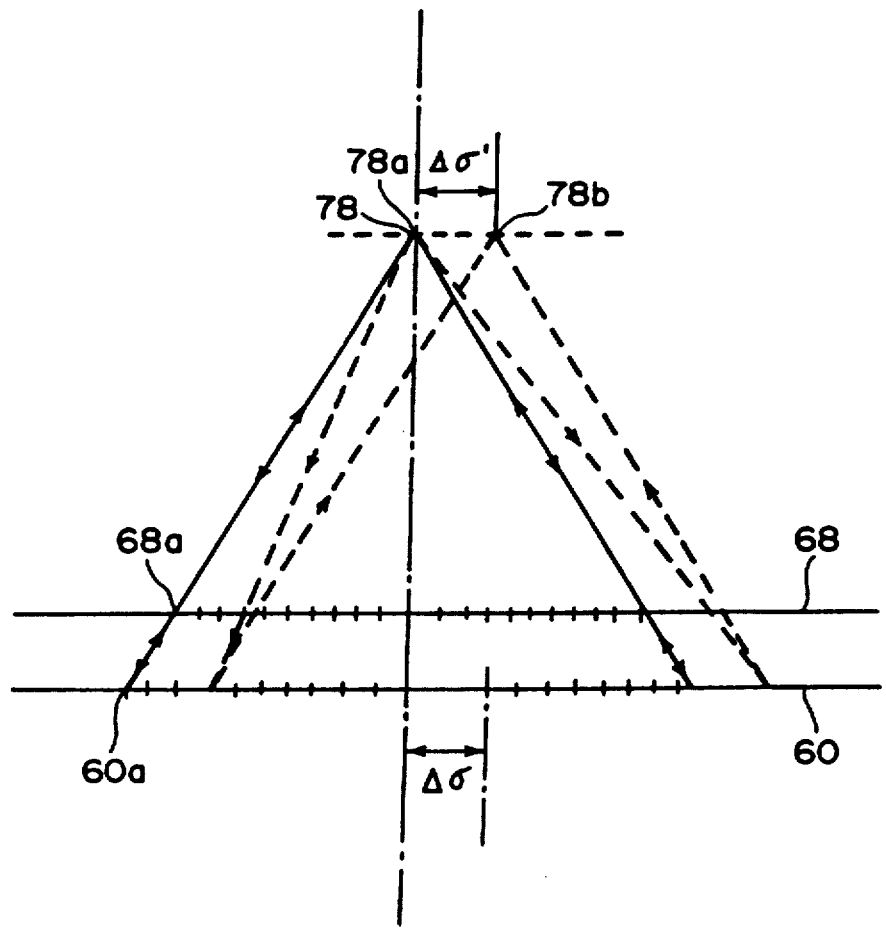

Referring to FIGS. 3A and 3B, wherein FIG. 3A is a view taken on an x-z plane while FIG. 3B is a view taken on a y-z plane, a description will be provided of a basic principle of how to detect a relative position of two objects such as a mask and a wafer, for example, with respect to a direction perpendicular to the direction in which the two objects are opposed to each other. Denoted in these Figures at 1 is a first object such as a mask which is fixedly supported within an unshown apparatus such as an exposure apparatus. Denoted at 2 is a second object such as a semiconductor wafer which should be aligned with the first object 1. Denoted at 3s and 4s are first and second physical optic elements which are provided in portions of the first and second objects, respectively. Each of the first and second physical optic elements is an element adapted to change an inputted wave surface and may comprise a straight regular-pitch grating or Fresnel zone plate, for example. In this example, each of these physical optic elements is provided by a grating lens such as a Fresnel zone plate which may be considered as a spherical lens. Denoted at 5 is an impinging parallel light, and denoted at 9 is a light receiving surface (detecting surface) of a photodetector which is operable to detect the position of a received light in an x-axis direction, in this example.

In the arrangement of this example, the first and second objects 1 and 2 (with respect to which any relative positional deviation should be evaluated) are provided with first and second physical optic elements 3s and 4s, respectively, each having the same light converging function with respect to both of x-axis and y-axis directions. Light 5 is projected upon the first physical optic element 3s, and light 6 emanating therefrom enters the second physical optic element 4s. Then, light 7 emanating from the second physical optic element 4s is converged and collected upon the detecting surface 9 of the photodetector which may comprise a CCD line sensor, for example.

In this case, upon the detecting surface 9, there occurs a displacement $\Delta\delta$ of the center of gravity of a received light, of an amount corresponding to any relative positional deviation $\Delta\sigma$ between the first and second objects 1 and 2. This will be explained in greater detail.

Any relative positional deviation of the first and second objects in this x-axis direction causes misalignment of the optical axes of the grating lenses 3s and 4s. In that occasion, the position of incidence upon the grating lens 4s of the chief ray of the light emanating from the grating lens 3s changes in accordance with the positional deviation. As a result, the angle of emission of the light from the grating lens 4s changes accordingly and, therefore, the position of convergence of the light 7 (which may be called an "alignment light") is displaced accordingly. The amount of such a displacement of the convergence position is substantially proportional to the relative positional deviation of the first and second objects.

Here, the term "center of gravity of light" means such a point that, when in the cross-section of the light a position vector of each point in the section is multiplied by a value which can be determined as a function of the light intensity of that point and the thus obtained products are integrated over the entire section, the integrated value has a "zero vector".

Assuming now that the second object is deviated relative to the first object by an amount $\Delta\sigma_x$ in the x-axis direction and where the distance to the second physical optic element from a point of convergence (or an origin of divergence) of the light which is going to be incident on the second object is denoted by a and where the distance to the detecting surface 9 from the second physical optic element is denoted by b (the distance a is positive when the point of convergence (the origin of divergence) is at a front side of the physical optic element while the distance b is positive when the same is at a rear side of the physical optic element), then a corresponding displacement $\Delta\delta_x$ of the center of gravity of the converged light upon the detecting surface 9 in the x-axis direction is given by:

$$\Delta\delta_x = \Delta\sigma_x \times (b/a + 1) \qquad (a)$$

Namely, the positional deviation $\Delta\sigma_x$ is transformed into a displacement $\Delta\delta_x$ of the center of gravity of light, having been magnified with a magnification "b/a+1".

Thus, by detecting the displacement $\Delta\delta_x$ of the center of gravity, it is possible to detect through equation (a) the positional deviation $\Delta\sigma_x$ of the second object relative to the first object with respect to the x-axis direction. Assuming that in the state shown in FIG. 3A the first and second objects are placed in a desired positional relationship and, if the second object 2 shifts in the x-axis direction from the illustrated position, it is possible to detect a corresponding change in the position of incidence, in the x-axis direction, of the light 7 upon the detecting surface 9. The other words, it is possible to detect a displacement $\Delta\delta_x$ of the center of gravity of the light 7 in the x-axis direction. Therefore, from equation (a), the positional deviation $\Delta\sigma_x$ of the second object in the x-axis direction can be detected. The reference position on the detecting surface 9, i.e., the position of incidence of the light 7 upon the detecting surface 9 when the first and second objects are in a desired or reference positional relationship, can be easily determined beforehand by trial printing of wafers, for example.

As will be readily understood from FIG. 3B, where in this example any positional deviation is to be detected only with respect to the x-axis direction, and if the second object is displaced relative to the first object in the y-axis direction, the point of convergence of the light 7 displaces in the y-axis direction in accordance with the same principle and at the same magnification. While a small-size and simple CCD line sensor may be used as a detector for detecting displacement of light only in the x-axis direction (such a line sensor may preferably be disposed in the plane of the detecting surface 9 with its sensing element array extending in the x-axis direction), if the second object shifts in the y-axis direction, the spot of light 7 displaces in a direction perpendicular to the direction of the sensing element array of the sensor. It is therefore possible that the light 7 fails to impinge on the detecting surface, resulting in failure of detection. If the size of the detecting surface in the y-axis direction is made large to avoid such inconveniences, a problem of susceptibility to noise results.

Figure 4A:
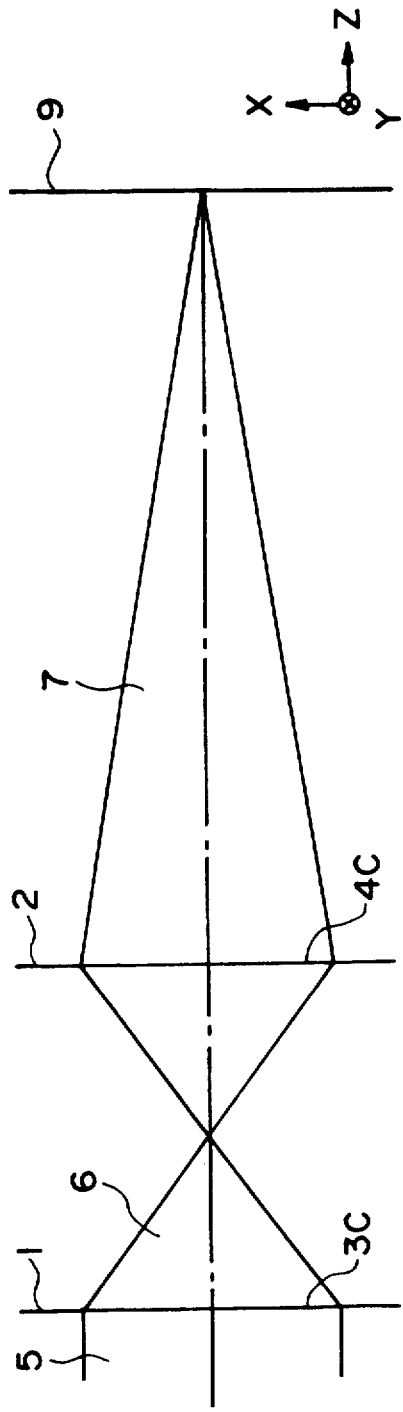
Figure 4B:
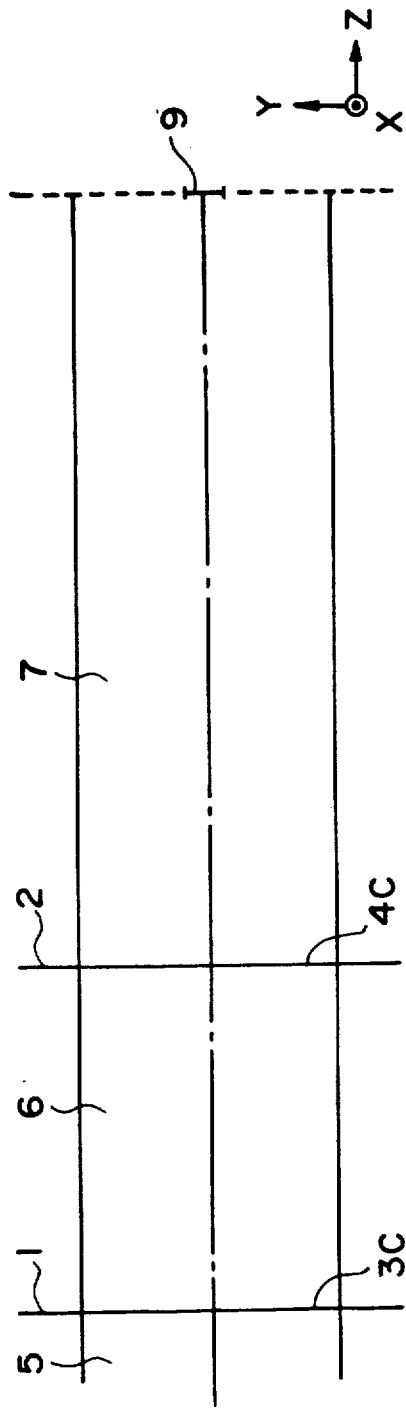

Referring to FIGS. 4A and 4B wherein FIG. 4A is a view taken on an x-z plane while FIG. 4B is a view taken on a y-z plane, another example will be explained. Like numerals as used in the foregoing example are assigned to corresponding or similar elements. Denoted in these FIGS. at 3c and 4c are first and second physical optic elements, respectively, each being provided by a grating lens having a light collecting function only with respect to one direction (x-axis direction in this example) but having neither a function for converging nor a function for diverging light with respect to a perpendicular direction (y-axis direction in this example). Namely, each grating lens functions like a "cylindrical lens". As for such a grating lens, one such lens disclosed in U.S. Pat. No. 4,311,389, for example, may be used.

If the second object is displaced relative to the first object in the x-axis direction, the light 7 which is linearly converged in this example upon the detecting surface 9 is displaced in the x-axis direction, in the plane of the detecting surface 9, in accordance with a similar principle as having been described with reference to FIG. 3A. Therefore, by detecting any displacement of the position of incidence of the light 7 upon the detector 9, which may comprise a CCD line sensor or otherwise as in the example shown in FIGS. 3A and 3B, it is possible to detect the positional deviation of the second object. On the other hand, as will be readily understood from FIG. 4B, since each of the grating lenses 3c and 4c has no or substantially no light converging or diverging function with respect to the y-axis direction, any shift of the second object in the y-axis direction accompanied by displacement of the grating lens 4c does not result in displacement of the light in the y-axis direction. Thus, as compared with the example of FIGS. 3A and 3B, even if the detector 9 has a light receiving surface which is small in the y-axis direction, any displacement of the second object in the y-axis direction does not result in failure of reception of light by the light receiving surface. Since, however, the light 7 is not converged or collected in the y-axis direction, as illustrated in FIG. 4B, there is a large loss in regard to the quantity of light to be received. If the size of the detector 9 in the y-axis direction is made large to avoid such inconveniences, the problem of susceptibility to noise results, as described hereinbefore.

Figure 5A:
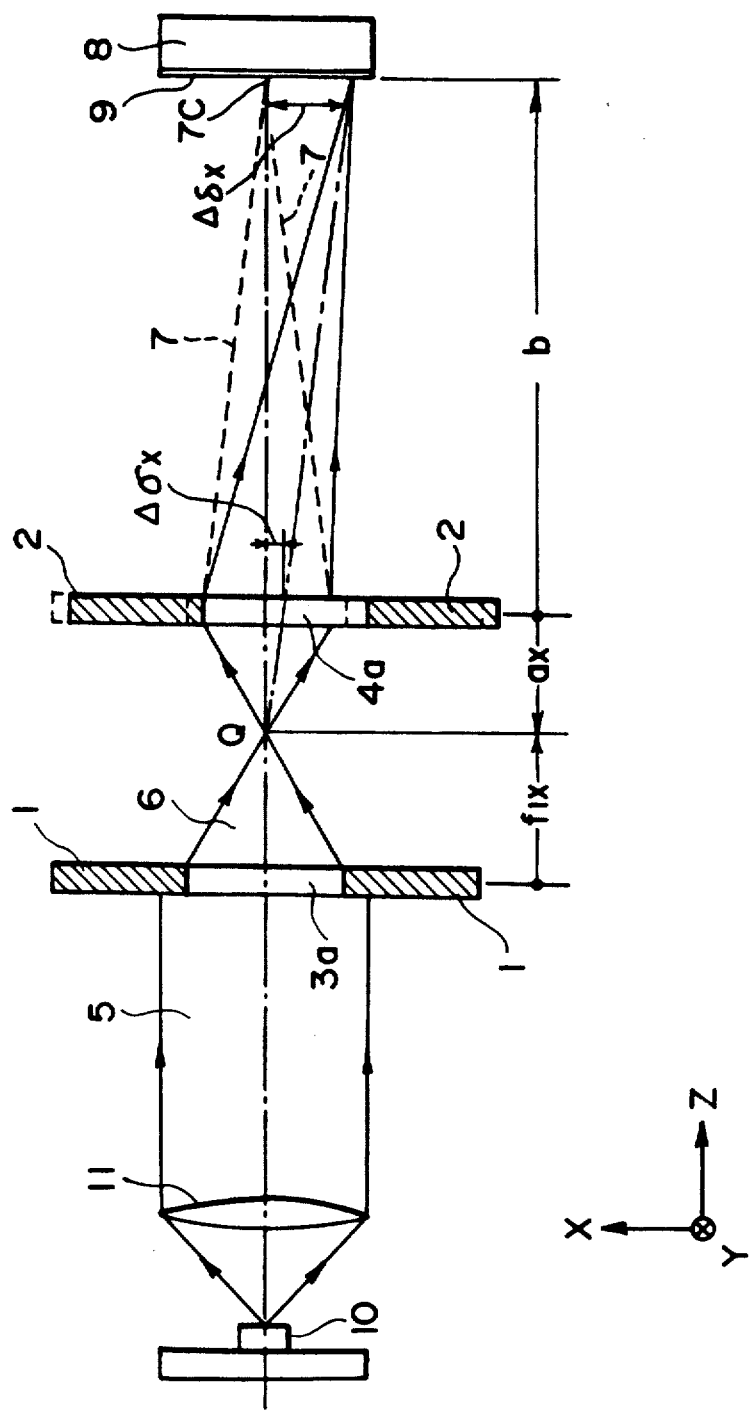
FIGS. 5A and 5B are schematic representations, respectively, for explicating a first embodiment of the present invention.
Figure 5B:
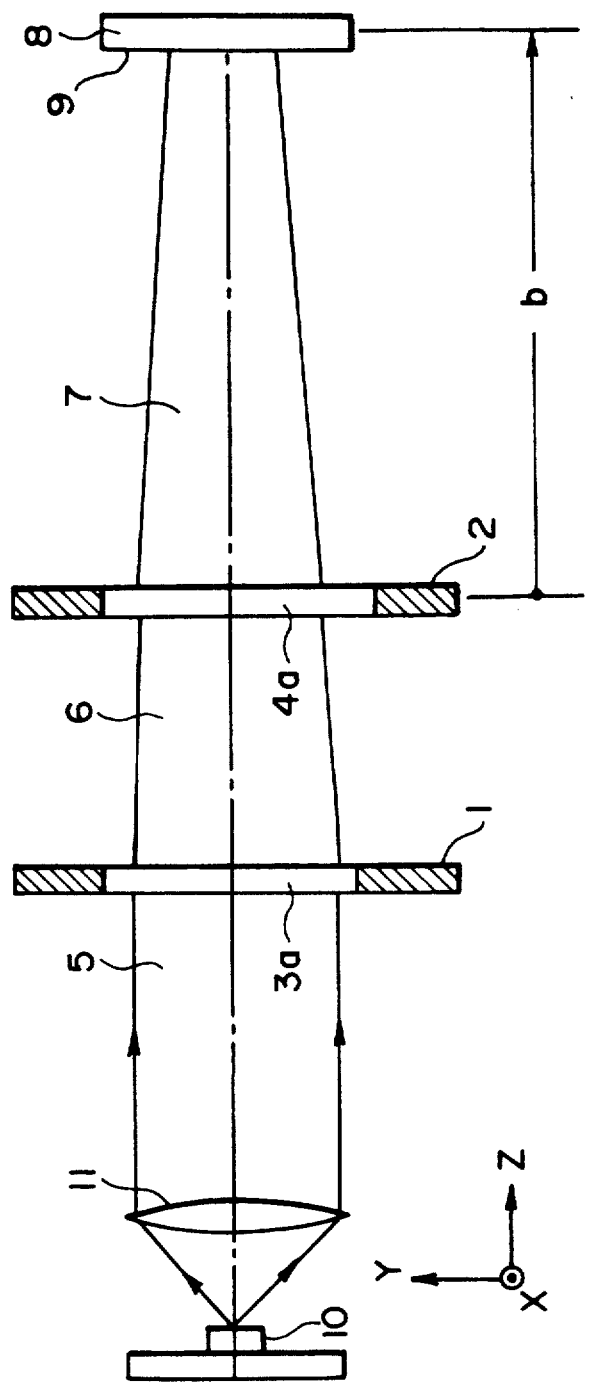

Referring now to schematic representations of FIGS. 5A and 5B, a description will be provided of a first embodiment of the present invention. FIG. 5A is a view taken on an x-z plane, while FIG. 5B is a view taken on a y-x plane.

In this embodiment, light emanating from a light source 10 which may comprise a semiconductor laser, for example, is transformed into parallel light by means of a light projecting lens system 11, the parallel light irradiating a first physical optic element 3a which is provided in a portion of a first object 1. In this embodiment, the first physical optic element 3a is provided by a grating lens having different light converging functions with respect to x-axis and y-axis directions. Namely, it can function as a toric lens and is operable to focus, in the x-z plane, an emanating light at a point Q which is at a focal distance $f_{1x}$ from the first physical optic element 3a, as seen in FIG. 5A.

Light divergingly advancing from the point Q enters a second physical optic element 4a which is provided in a portion of a second object 2 disposed at a distance $a_x$ from the point Q. Similarly to the first physical optic element 3a, the second physical optic element 4a is provided in this embodiment by a grating lens having different light converging functions with respect to the x-axis and y-axis directions. Namely, it can function as a toric lens and is operable to converge, in the x-z plane, an emanating light from the element 4a upon a detecting surface 9 of a detector 8 disposed at a distance b from the second object. Namely, in this embodiment, the first and second physical optic elements 3a and 4a cooperate to provide what can be called a "convex-convex system".

In accordance with this embodiment, first and second objects 1 and 2 (with respect to which any relative positional deviation should be evaluated) are provided with first and second physical optic elements 3a and 4a, respectively, as having the described structures. Light 5 is projected upon the first physical optic element 3a, and light 6 emanating therefrom enters the second physical optic element 4a. Then, light 7 emanating from the second physical optic element 4a is converged in the x-z plane and collected upon a detecting surface 9 of a detector 8 which may comprise a CCD line sensor, a position sensor or otherwise.

In that case, any relative positional deviation between the first and second objects 1 and 2 of an amount $\Delta\sigma_x$ produces, upon the detecting surface 9, a corresponding displacement $\Delta\delta_x$ of the center of gravity of received light, in a similar manner as having been described with reference to FIGS. 3A and 4A.

In this embodiment, the position of the center of gravity of light 7 incident on the detecting surface 9, as depicted by broken lines, is used as a reference and, by detecting any displacement $\Delta\delta_x$ upon the detecting surface 9 of the center of gravity of light 7a as depicted by solid lines, any relative positional deviation $\Delta\sigma_x$ between the first and second objects 1 and 2 is detected. The principle of detection is substantially the same as having been described with reference to FIGS. 3A and 4A.

In this embodiment, the relative positional relationship between the first and second objects 1 and 2 with respect to the x-axis direction can be detected, by utilizing the basic principle described above.

In FIGS. 5A and 5B, the first and second physical optic elements 3a and 4a and the detecting surface 9 are maintained parallel to each other. Where the position denoted at 7c of the center of gravity of the light 7 (broken lines) collected upon the detecting surface 9 represents a reference state in which the first and second objects contain no relative positional deviation and if the second physical optic element 4a then shifts in the x-axis direction by an amount $\Delta\sigma_x$, as illustrated, relative to the first physical optic element 3a which is used as a reference, then a corresponding displacement $\Delta\delta_x$ of the converged light upon the detecting surface 9 in the x-axis direction is expressed as follows:

$$\Delta\delta_x = \Delta\sigma_x \times (b/a_x + 1) \tag{1}$$

Namely, the positional deviation $\Delta\sigma_x$ can be detected in terms of a displacement $\Delta\delta_x$ of the center of gravity of light having been magnified with a magnification "$b/a_x + 1$".

It is seen therefrom that, for enhanced precision for the detection of positional deviation, desirably a relationship "$b >> a_x$" is satisfied. More particularly, the value of b/a is preferably within a range of 50–400.

As seen in FIG. 5B, the optical system is arranged such that, with respect to the y-axis direction, the light source and the light receiving surface is not brought into an optically conjugate relationship.

Further, it is seen in FIG. 5B that each of the used grating lenses 3a and 4a has a light converging function also in the y-z plane, for converging a received light to emit a convergent light. However, the focal length of each grating lens 3a or 4a in this y-z plane is a finite length different from its focal length in the x-z plane.

Assuming now that the distance to the second physical optic element from an imaginary point of convergence of light which will be incident on the second physical optic element (i.e. the point upon which light 6 converges if the second physical optic element 4a is absent) is denoted by $a_y$ and the distance to the detecting surface from the second physical optic element is denoted by b, then any shift of the second object 2 in the y-axis direction of an amount $\Delta\sigma_y$ results in a displacement $\Delta\delta_y$ in the y-axis direction of the center of gravity of light 7 incident upon the detecting surface 9, which can be given by:

$$\Delta\delta_y = \Delta\sigma_y \times (1 + b/a_y)$$

In this embodiment, a relationship $|a_y| >> |a_x|$ is satisfied and, as a result, it is possible to make smaller the magnification of displacement of the center of gravity of light to the positional deviation of the second object in the y-axis direction, than that to the positional deviation in the x-axis direction. Additionally, as illustrated in FIG. 5B, the optical arrangement is such that the detecting surface 9 receives a partially converged light 7, and this makes it possible to reduce any loss of the light quantity to be detected as well as to reduce the size of a used detector in the y-axis direction.

In accordance with the present embodiment, as described, by providing first and second objects with respective physical optic elements which may be grating lenses each having a function like a toric lens, it becomes possible to efficiently direct light, emanating from one physical optic element, to another physical optic element provided in a portion of the second object and, additionally, it becomes possible to detect with high precision the position of center of gravity of light upon a predetermined plane. As regards the magnification of $\Delta\delta_y$ to $\Delta\sigma_y$, it may preferably be set while taking into account a possible positional error in the y-axis direction, so as to prevent that alignment light 7 from missing the detecting surface 9 with respect to the y-axis direction. Also, further reduction the loss of light quantity is attainable by reducing the diameter or size of light upon the light receiving surface, with respect to the y-axis direction, as compared with its original diameter.

An alignment process to be adopted in the present embodiment may be such as follows.

In one example the relationship of a deviation signal $\Delta\delta_x$ representing displacement of the center of gravity of light on the detecting surface of the detector 8, with respect to positional deviation $\Delta\sigma_x$ between two objects, is predetected and a corresponding characteristic (e.g. proportional coefficient) representing that relationship is determined in preparation. Then, from the value of a deviation signal $\Delta\delta_x$, the positional deviation $\Delta\sigma_x$ between these objects at that time is detected and, thereafter, the first or second object is displaced by an amount corresponding to the detected positional deviation $\Delta\sigma_x$.

In a second example from a deviation signal $\Delta\delta_x$ representing displacement of the center of gravity and outputted from the detector 8, the direction that cancels the positional deviation $\Delta\sigma_x$ is detected. In this direction, the first or second object is displaced, and the above-described process is repeated until the positional deviation $\Delta\sigma_x$ comes into a tolerable range.

A physical optic element as having a function such as described hereinbefore can be provided by an amplitude type zone plate, for example. In that case, a zone plate may have a pattern which can be determined in the following manner.

Where, as illustrated in FIG. 6A, parallel light is projected upon a zone plate 51 having a focal length $f_x$ in an x-z plane and assuming that $mI_x$ denotes the number of zones of the zone plate 51, $\lambda$ denotes a used wavelength, D denotes the aperture diameter and $\theta$ denotes the half angle of convergence of light, then on an x axis passing through the center of the zone plate there are established the following relations:

$$\left. \begin{array}{l} f_x/\cos\theta - f_x = mI_x\lambda \\ (D/2)/f_x = \tan\theta \end{array} \right\} \tag{2}$$

Thus, on the x axis passing through the center of aperture the "$mI_x$-th" zone has a relationship with a zone plate radius D/2, measured from the center of aperture, which is expressed as follows:

$$mI_x = (f_x/\lambda)[\sqrt{(D/2f_x)^2 + 1} - 1] \tag{2a}$$

On the other hand, as illustrated in FIG. 6B wherein light from a linear light source 52 converges in an x-z plane upon a light receiving surface 9 by a zone plate 51 (such as a zone plate which may be provided on the second object 2 shown in FIG. 5A), assuming that a denotes the distance from the light source 52 to the zone plate 51, b denotes the distance from the zone plate 51 to the light receiving surface 9, $\theta_a$ denotes a half angle of divergence of light from the light source 52, and $\theta_b$ denotes a half angle of convergence of light impinging on the light receiving surface, then there are the following relations:

$$a(1/\cos\theta_a - 1) + b(1/\cos\theta_b - 1) = mII_x\lambda \quad (3)$$
$$D/2a = \tan\theta_a$$
$$D/2b = \tan\theta_b$$

Thus, on the x-axis passing through the center of aperture, the "$mII_x$-th" zone has a relationship with a zone plate radius D/2, measured from the center of aperture, which is expressed as follows:

$$mII_x = (a/\lambda)[\sqrt{(D/2a)^2 + 1} - 1] + \quad (3a)$$
$$(b/\lambda)[\sqrt{(D/2b)^2 + 1} - 1]$$

Similarly, where a zone plate has a focal length $f_y$ in a y-z plane, in the examples of FIGS. 6A and 6B, on a y-axis passing through the center of an aperture, each of the "$mI_y$-th" zone and the "$mII_y$-th" zone has a relationship with the zone plate radius D/2, which relationship can be given by substituting $f_x$ in equation (2) or (2a) by $f_y$.

It is seen therefrom that a zone plate may be one having a two-dimensional pattern like an ellipse having an ellipticity of $f_x/f_y$.

If, for example, D=180 microns, $\lambda$=0.83 micron, $f_x$=1000 microns, $f_y$=250 microns, a=500 microns and b=50000 microns, then a zone plate 3a to be provided on a first object 1 may have zones of a number $mI_x$=4.9 and $mI_y$=9.8, while a zone plate 4a to be provided on a second object 2 may have zones of a number $mII_x$=10.4 and $mII_y$=20.8.

In the present embodiment, for convenience, optogeometric displacement of a chief ray is considered as being proportional to a relative positional deviation. Actually, however, if the relative positional deviation is extremely large, there appears a non-linearity in the displacement of the center of gravity of light upon the detecting surface 9, due to the aberration of a Fresnel zone plate. However, such non-linearity can be corrected by, for example, memorizing such a non-linear relationship in preparation and by executing appropriate correction at the time of calculation.

Since, in this embodiment as described hereinbefore, a grating lens having different lens functions in regard to a deviation detecting direction (a direction with respect to which any positional deviation should be detected) and a direction perpendicular to that detecting direction, is used, it is possible to reduce in size the detecting surface 9. As a result, the possibility of reception by the detecting surface 9 of noise components such as an unwanted scattered light component and an unwanted diffraction light component can be reduced significantly. Therefore, it is possible to assure high positional error detection accuracy as high as 0.005 micron, for example.

On the other hand, the structure can be such that a positional deviation of 20 microns in the y-axis direction (the direction perpendicular to the deviation detecting direction) simply causes only a small displacement of the center of gravity of light upon the detecting surface 9, of an amount of 41 microns, for example. This is a significant advantage.

While in this embodiment parallel light is projected perpendicularly upon a first physical optic element 3a, a convergent light or a divergent light may be projected thereupon. In that case, a second physical optic element 4a will be set to ensure that the position of convergence of an inputted light by the first physical optic element 3a is placed in an imaging relationship with the detecting surface 9.

Figure 7:
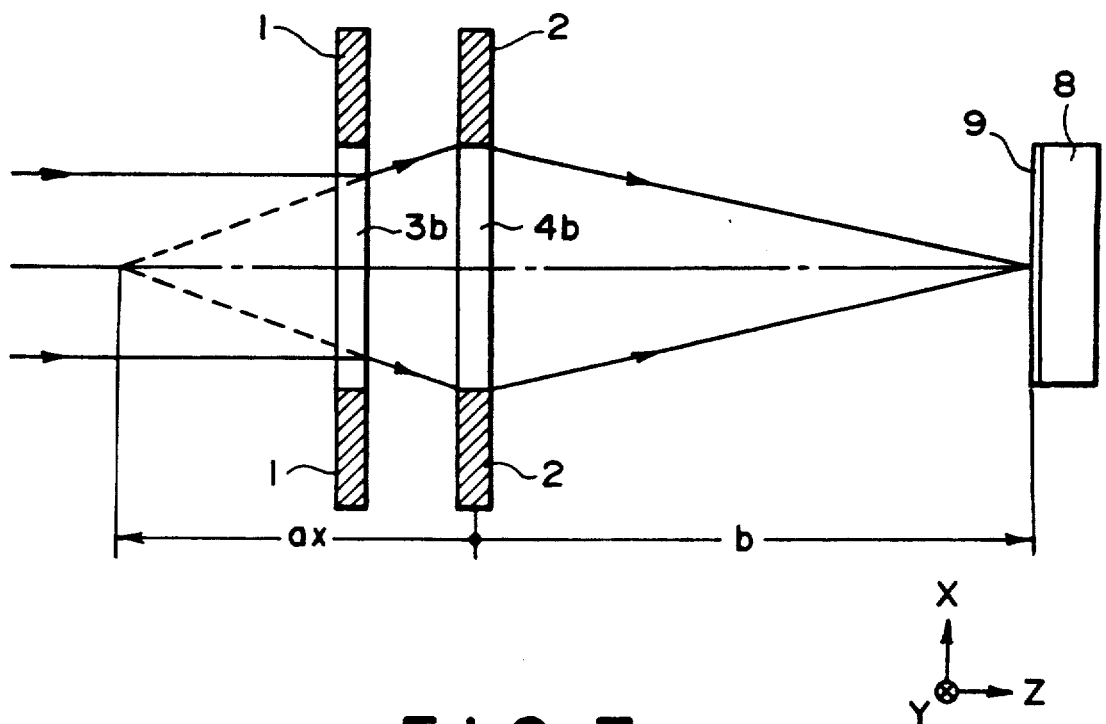
FIG. 7 is a schematic representation for explicating a second embodiment of the present invention.
Figure 8:
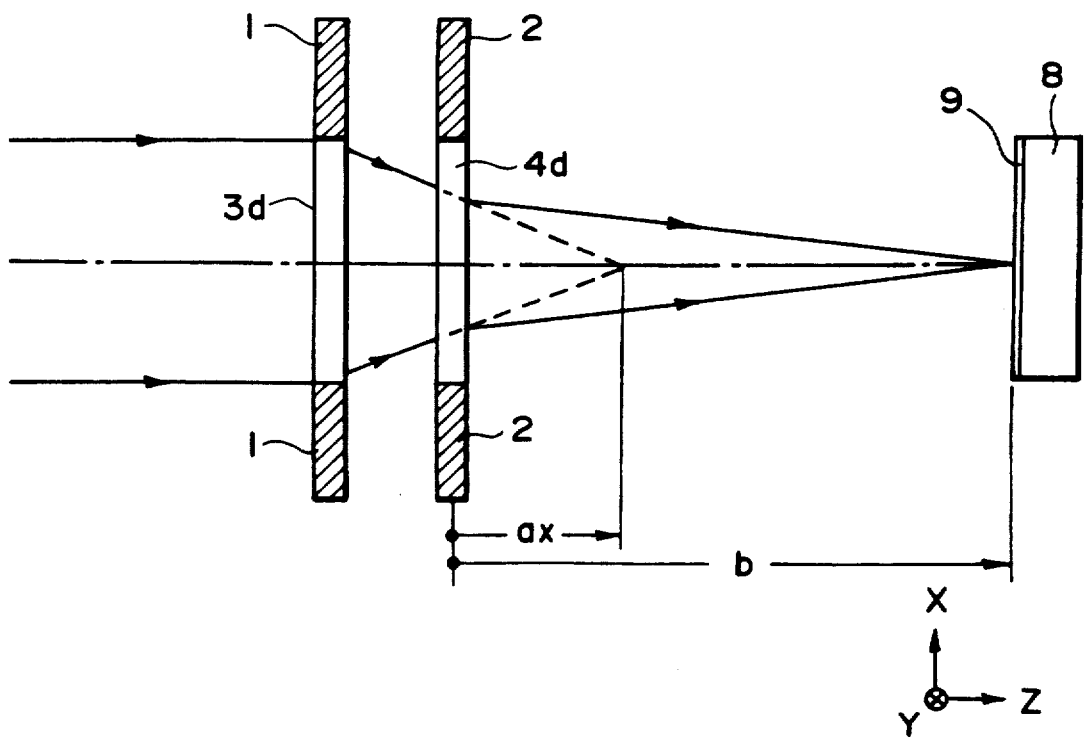
FIG. 8 is a schematic representation for explicating a third embodiment of the present invention.

FIGS. 7 and 8 are schematic representations, respectively, showing major portions of second and third embodiments of the present invention. In the second embodiment of FIG. 7, a first physical optic element 3b is provided by a grating lens having a light diverging function in an x-z plane. Second physical optic element 4b is provided by a grating lens light converging function in the x-z plane. Thus, these grating lenses cooperate to provide what can be called a "concave-convex system". The state of convergence of light in a y-z plane in this embodiment is similar to that of the FIG. 5B example. In this embodiment, the relationship of $\Delta\delta_x$ with $\Delta\sigma_x$ can be expressed by the same equation (1) as in the earlier example.

In the third embodiment of FIG. 8, a first physical optic element 3d is provided by a grating lens having a light converging function in an x-z plane, and a second physical optic element 4d is provided by a grating lens having a light diverging function in the x-z plane. Thus, these grating lenses cooperate to provide what can be called a "convex-concave system". The state of convergence of light in a y-z plane in this embodiment is similar to that shown in FIG. 5B. In this embodiment, a positional deviation $\Delta\sigma_c$ of a second object from a reference position produces a displacement $\Delta\delta_c$ of the center of gravity of light upon a detecting surface 9, which is given by:

$$\Delta\delta_c = (b_{2c}/a_{2c} + 1)\Delta\sigma_c$$

Whether or not a used physical optic element of this embodiment is a concave lens or a convex lens is determined on the basis of whether it uses diffraction light of a positive order or it uses diffraction light of negative order.

Similarly to the first embodiment, in the second and third embodiments, an alignment mark (grating lens) having different focal lengths in a direction of deviation detection and a direction perpendicular to that direction, is used and, with this arrangement, it is possible to ensure high-precision positional deviation detection with no or substantially no scattered light or unwanted diffraction light impinging on the detecting surface, as in the first embodiment.

In regard to the direction perpendicular to the deviation detecting direction (i.e. the direction perpendicular to the sheet of the drawing), the magnification sensitivity to positional deviation can be set small, for example, about "x2".

A suitable optical arrangement may be appropriately selected out of those described hereinbefore, in accordance with the spacing between the first and second objects 1 and 2 and the magnitude of the apertures of the first and second physical optic elements. For example, where the spacing is sufficiently large as compared with the apertures of the first and second physical optic elements, the "convex-convex system" such as shown in FIGS. 5A and 5B is preferable. On the other hand, where the spacing is not sufficiently large as compared with the apertures (typically in a case of a mask and a wafer to be used in a proximity type exposure apparatus), a "concave-convex system" such as shown in FIG. 7 or a "convex-concave system" such as shown in FIG. 8 is preferable.

Further, the case where the aperture of a second physical optic element can be made larger than that of a first physical optic element, as in the FIG. 7 example, a "concave-convex system" such as shown in the same Figure is preferable. On the other hand, where the aperture of a first physical optic element can be made larger than that of a second physical optic element, as in the FIG. 8 example, a "convex-concave system" such as shown in the same Figure is preferable.

While the foregoing embodiments use transmission type physical optic elements, the objects and advantageous features of the present invention can be accomplished as a matter of course by using reflection type physical optic elements.

Figure 9:
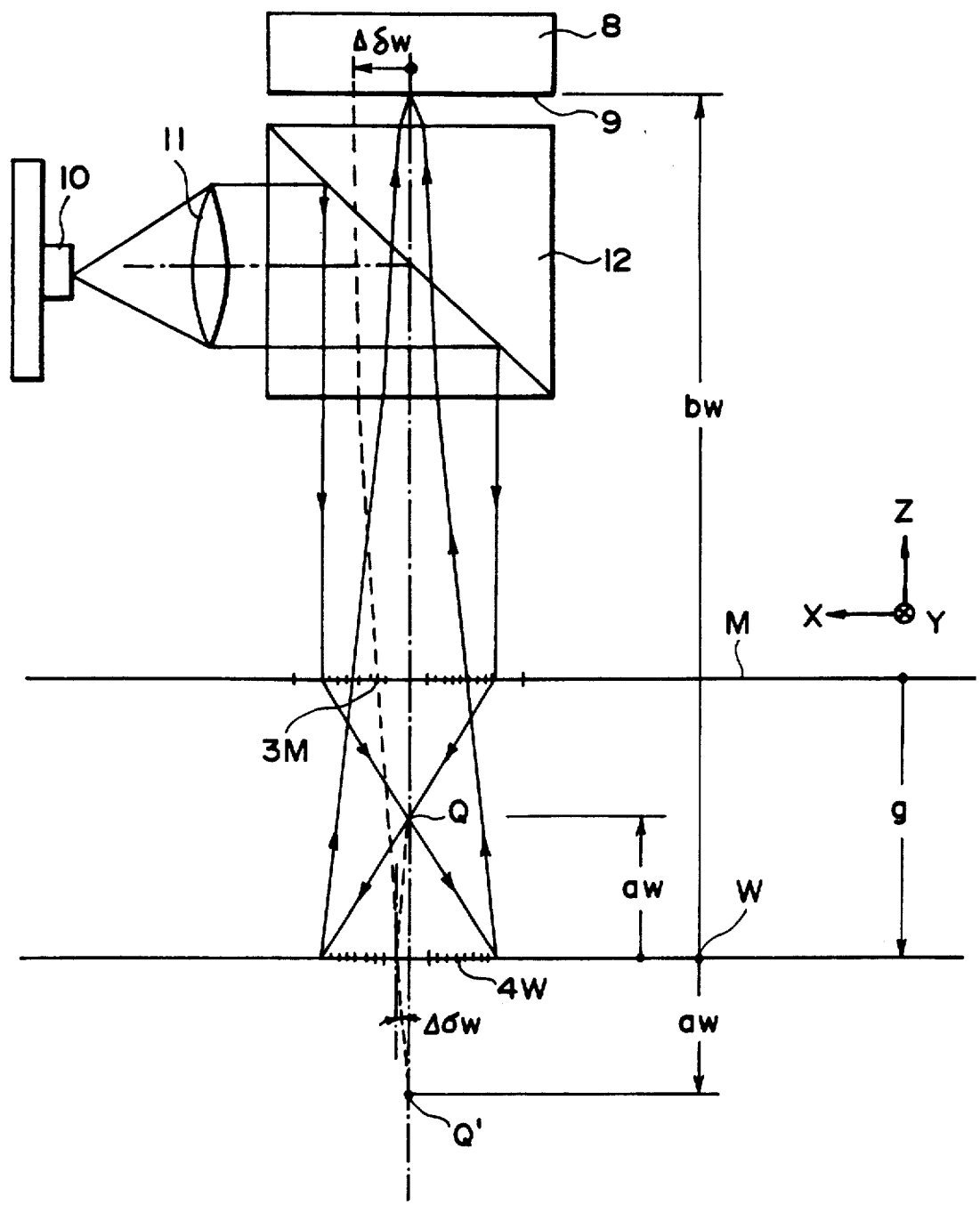
FIG. 9 is a schematic representation, showing an optical arrangement of a position detecting system according to a fourth embodiment of the present invention.

Referring now to FIG. 9, a description will be provided of a fourth embodiment of the present invention. In this embodiment, the invention is applied to an alignment system incorporated into a semiconductor device manufacturing exposure apparatus of proximity exposure type, for aligning a mask M and a wafer W.

In FIG. 9, the same reference numerals used in FIG. 5 are assigned to similar or corresponding elements. In FIG. 9, reference character M denotes a mask and reference character W denotes a wafer, which correspond respectively to a first and second objects to be relatively aligned. Reference character 3M denotes a mask alignment pattern which is formed in a portion of the mask M and which corresponds to a first physical optic element. Reference character 4W denotes a wafer alignment pattern provided in a portion of the wafer W and it corresponds to a second physical optic element of the reflection type.

In FIG. 9, light emanating from light source 10 is collimated into a parallel light by a lens system 11, and after passing through a half mirror 12 the parallel light impinges upon the mask alignment pattern 3M. The mask alignment pattern 3M is provided, in this embodiment, by a zone plate of the transmission type and is adapted to focus a received light at a point Q which is in front of the wafer W. Denoted at 10 is a light source which may comprise a semiconductor laser, an He-Ne laser, an Ar laser or otherwise, and which provides a coherent light. Alternatively, the light source 10 may comprise a light emitting diode or otherwise that produces an incoherent light. The light focused at the point Q then divergingly advances and impinges upon the alignment pattern 4W of the wafer. The wafer alignment pattern 4W is provided, in this embodiment, by a zone plate of reflection type and is adapted to reflect an inputted light so that, after passing the mask M and the half mirror 12, it is converged upon a detecting surface 9.

In principle, the embodiment of FIG. 9 corresponds to such structure that, in the optical arrangement shown in FIGS. 5A and 5B, the grating lens 4a is replaced by one of the reflection type and, accordingly, the light 7 and the photodetector 8 which are on the right-hand side of the grating lens 4a as viewed in the drawings are placed on the left-hand side thereof. Thus, in the present embodiment, the manner of displacement of the center of gravity of light in the x-axis direction resulting from a positional deviation of the wafer W in the x-axis direction; the manner of detecting the positional deviation by using such a displacement; and the manner of displacement of light in the y-axis direction caused by shift of the wafer W in the y-axis direction, are all the same as those in the first embodiment. After any positional deviation in the x-axis direction is detected, an unshown wafer driving mechanism is actuated to move the wafer W in the x-axis direction to correct the detected positional deviation, whereby the mask M and the wafer W are aligned with each other with respect to this direction.

Figure 10:
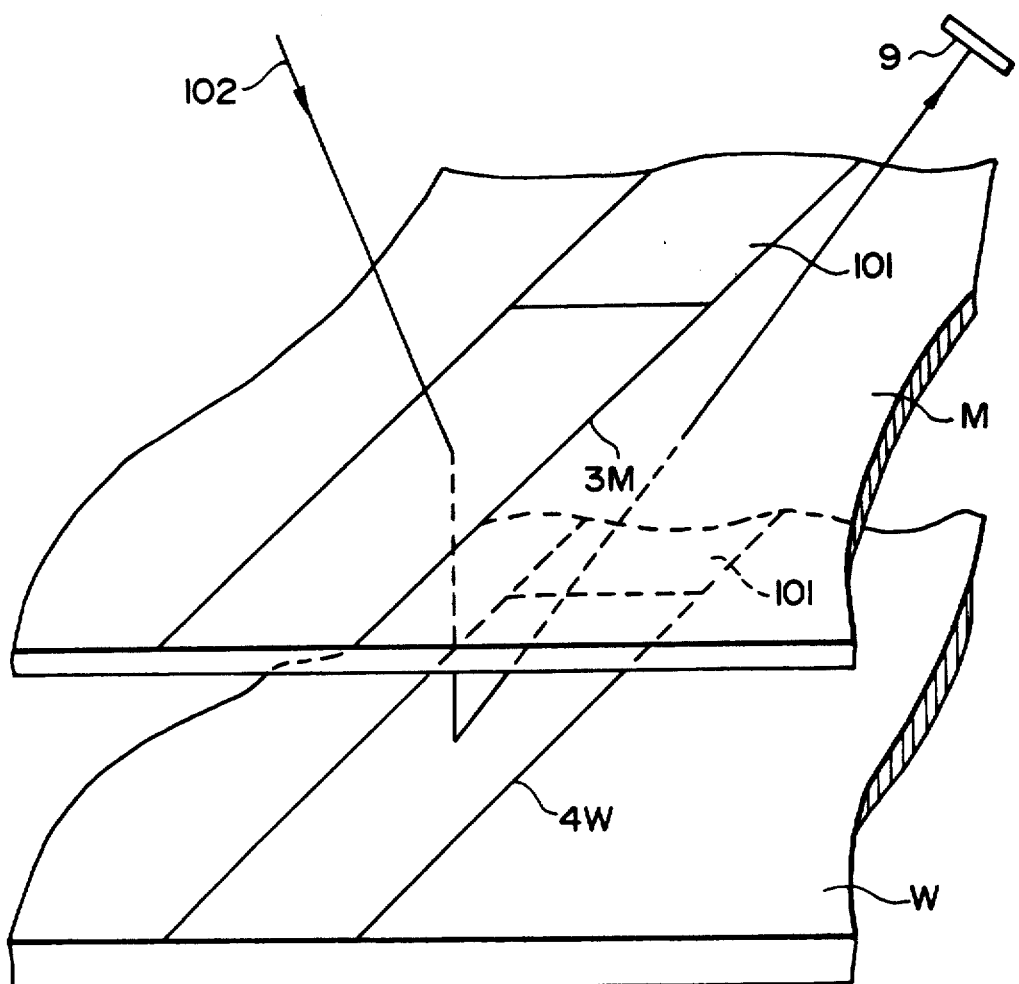
FIG. 10 is a fragmentary perspective view, schematically showing a position detecting system according to a fifth embodiment of the present invention.

FIG. 10 is a schematic representation of a major portion of a fifth embodiment of the present invention. In FIG. 10, numerals used in FIG. 9 are assigned to similar or corresponding elements.

In this embodiment, alignment marks 4W and 3M of a wafer W and a mask M, respectively, are provided on scribe lines 101 of the wafer W and the mask M, respectively. Denoted at 102 is a coherent light supplied from an unshown light source such as a semiconductor laser, an He-Ne laser, an Ar laser or otherwise included in an alignment head (not shown). Alternatively, the light 102 may be an incoherent light supplied from a light emitting diode, for example.

In FIG. 10, depicted at numeral 102 is the path of a chief ray, along which light 102 is incident on the mask M surface at a predetermined angle and, after being diffracted by the alignment marks 3M and 4W of the mask M and the wafer W, it advances and is received as a signal light by a detecting surface 9 of a photodetector which may comprise a one-dimensional CCD sensor, for example.

In this embodiment, the direction with respect to which the mask and the wafer should be aligned is set in a lengthwise direction of the scribe line 101 (i.e. in the x-axis direction).

The alignment marks 3M and 4W used in this embodiment will be explained in greater detail.

The alignment marks 3M and 4W each is provided by a so-called Fresnel zone plate (or a grating lens) having a predetermined focal length. Of these marks, the alignment mark 3M is set so that the alignment light (102) inputted thereupon with inclination at a predetermined angle of incidence is transformed into a convergent (or divergent) light under the influence of the grating lens and the chief ray of light emanating from the mask M has a predetermined angle with respect to a normal to the mask surface.

It should be noted here that, in this embodiment, the grating lens has different lens functions with respect to the lengthwise direction of the scribe line (x-axis direction) and a direction (y-axis direction) perpendicular thereto. This is the same as the fourth embodiment.

In this embodiment, the alignment light has an angle of incidence with respect to a normal to the mask M surface which is equal to 10 degrees, for example, in the y-z plane. Also, the projection component of the inputted light upon the mask M surface is orthogonal to the scribe line direction (namely, it agrees with the y-axis direction).

The light transmissively diffracted by the alignment pattern 3M is (imaginarily) focused linearly, for example, at positions of 238.0 microns and 20.107 mm, respectively, below the wafer W surface, in a direction parallel to the y-axis direction and in a direction parallel to the x-axis direction, respectively. In that case, the focal length in the x-z plane is equal to 268 microns. Also, in that occasion, the interval between the mask M and the wafer W is equal to 30 microns, and each of the alignment marks 3M and 4W has a size which is 280 microns in the scribe line direction and 70 microns in the widthwise direction of the scribe line.

The alignment mark 4W is a signal light providing a grating lens provided on the wafer W surface, and it is set so that the light having been transmissively diffracted by the mask M surface, which is convergent (or may be divergent) in the x-z plane, converges or is collected at a predetermined position on the sensor 9 under the influence of a concave-lens function (which may be a convex-lens function) of the alignment mark 4W on the wafer W surface. For example, in this embodiment, the alignment pattern 4W has a grating pattern which is set so that: when the mask M and the wafer W has no relative positional deviation and, therefore, the alignment marks 3M and 4W just provide a coaxial system, the alignment light from the alignment mark 4W on the wafer W surface has an angle of emission of 5 degrees with respect to a normal to the wafer W surface and, additionally, it is in a direction orthogonal to the scribe line direction while, on the other hand, a spot which is focused in the deviation detecting direction (x-axis direction) upon the sensor 9 but which has a stripe-like extension in a direction perpendicular to the deviation detecting direction, is formed in the neighborhood of the center of the sensor.

As described, in this embodiment, each of the alignment marks 3M and 4W of the mask M and the wafer W is provided by a grating element which has a lens function in regard to the positional deviation detecting direction of the gravity center detecting sensor (i.e. in the scribe line direction) but which has a different lens function having a different focal length in a direction perpendicular to that deviation detecting direction, as in the foregoing embodiments.

As for the focal length in the deviation detecting direction (i.e. the lengthwise direction of the scribe line), in this example the grating lens of the mask provides a positive (convex lens) power of 268 microns while the grating lens of the wafer provides a negative (concave lens) power of 279 microns. On the other hand, as for the focal length in a direction perpendicular to the deviation detecting direction (i.e., in the y-axis direction), the grating lens of the mask provides a positive (convex lens) power of 2 mm, while the grating lens of the wafer provides a negative (concave lens) power of $-2.2$ mm.

Figure 11:
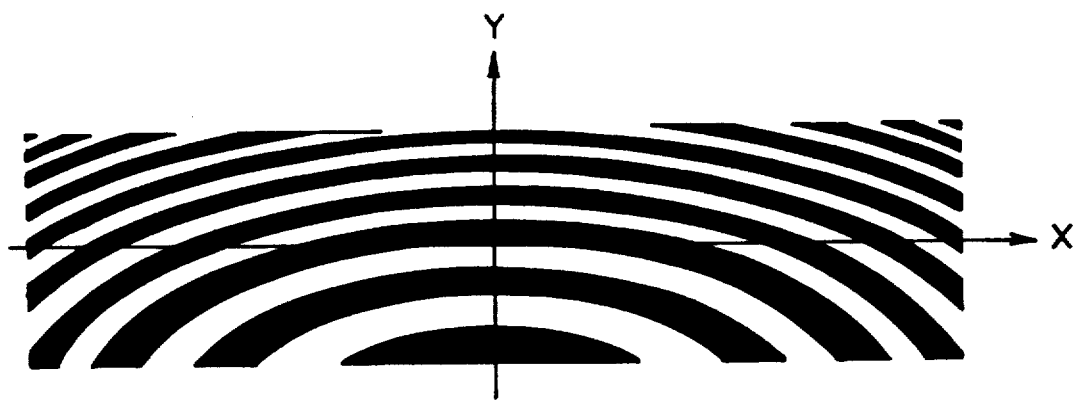
FIG. 11 is an enlarged plan view which exemplifies a pattern of a grating lens usable in the present invention.

A typical example of a pattern usable in such a grating lens is illustrated in FIG. 11.

The pattern exemplified in FIG. 11 has a lens function of a predetermined focal length in the x-axis direction, but it has a different focal length in the y-axis direction, which is different from that in the x-axis direction. Additionally, it has a function for deflecting the chief ray of a received light at a certain angle corresponding to the order of diffraction.

In an arbitrary x-z section, the illustrated pattern has a distribution of grating pitch which corresponds to the distribution of pitch of a Fresnel zone plate having the same focal length in the x-z plane as that of this example. Also, in a y-z section, the illustrated pattern has a grating pitch distribution which corresponds to the distribution of pitch of an off-axis type Fresnel zone plate having the same focal length in the y-axis direction as that of the lens of this example and being effective to form an image at a predetermined position.

As an example, alignment marks 3M and 4W (grating lens) usable in this embodiment can be prepared in the following manner:

First, the alignment mark 3M for a mask may be designed so that, when parallel light of a predetermined beam diameter is incident thereupon at a predetermined angle, the light is collected linearly at a predetermined position. Usually, a pattern of a grating lens may be that of an interference fringe which can be formed on a lens surface in the case where mutually coherent light sources are disposed at a light source position (object point) and the position of an image point. Making this assumption, a coordinate system is defined on a mask M surface, such as shown in FIG. 11. The origin is at the middle of the width of the scribe line, the x axis is in the direction of the scribe line, the y axis is in the widthwise direction and the z axis is in the direction of the normal of the mask M surface.

Here, it is assumed that parallel light is incident upon an arbitrary point (x, y, 0) on the mask M surface, at an angle $\alpha$ within the y-z plane with respect to a normal to the mask M surface, with its projection component being perpendicular to the scribe line direction (x-axis direction); and that the alignment mark 3M of the mask has a focal length $z_1$ in the x-z plane and a focal length $z_2$ ($z_1 \neq z_2$) in the y-z plane. Equations regarding a group of curved lines of such a grating lens pattern (x, y) by which an inputted parallel light, after being transmissively diffracted by the alignment mark 3M, is collected in the x-z plane at a position ($x_1$, $y_A$, $z_1$) (wherein $x_1$ and $z_1$ are constants) whereas it is collected in the y-z plane at a position ($x_A$, $y_2$, $z_2$) (wherein $y_2$ and $z_2$ are constants), can be expressed as follows:

$$y \sin\alpha + P_1(x,y) - P_2(y) = m\lambda/2 \qquad (4)$$

$$P_1(x,y) = \sqrt{(x - x_1)^2 + (y - y_A)^2 + z_1^2}$$

$$P_2(y) = \sqrt{x_1^2 + y_1^2 + z_1^2}$$

$$y_A = y_1 + |(z_2 - z_1)/z_2|y$$

$$x_A = x_1 + |(z_2 - z_1)/z_2|x$$

$$z_1/y_1 = z_2/y_2 \ (z_1 \neq 0, z_2 \neq 0)$$

wherein $\lambda$ is the wavelength. When the total number of zones is denoted by n, then m is an integral number which is in the range of 1 to 2n.

Assuming now that a chief ray is such a ray being incident with an angle $\alpha$ and passing through the origin on the mask surface M and then impinging upon a convergent point ($x_1$, $y_1$, $z_1$), then the left side of equation (4) represents the difference in length, with respect to the optical path of the chief ray, of the optical path of such a ray that passes a point (x, y, 0) on the mask M and then impinges on the point ($x_1$, $y_A$, $z_1$). In summary, equation (4) depicts that the difference in the optical path length is m/2 times larger than the wavelength.

On the other hand, a grating lens 4W to be provided on a wafer W may be designed in terms of an inputted light of wave surface having different powers (divergent or convergent angles) with respect to the x-axis and y-axis directions, and similarly to the grating lens of the mask M it may be provided by a grating lens having different focal lengths with respect to the x-axis and y-axis directions.

The case where a light of a wave surface as having different points of convergence (or origins of divergence) in the x-z plane and y-z plane is inputted into a grating lens 4W of a wafer and, after being influenced by different converging (or diverging) functions of the lens with respect to the x-z plane and the y-z plane, the light is collected upon planes $z=z_3$ and $z=z_4$, in the x-axis and y-axis directions, respectively, will now be explained.

If a grating lens should be designed so that an inputted light of a wave surface as having, as imaginary light sources, a linear light source extending in parallel to the y-axis direction and residing at a position $(x_1, y_A, z_1)$ (wherein $x_1$ and $z_1$ are constants) and a linear light source extending in parallel to the x-axis direction and residing at a position $(x_A, y_2, z_2)$ (wherein $x_2$ and $z_2$ are constants), when the inputted light is incident on such a grating lens (4W), is collected at positions $(x_3, y_B, z_3)$ in the x-z plane and $(x_B, y_4, z_4)$ in the y-z plane, then equations regarding a group of curved lines of such a grating lens can be expressed in the following manner:

$$\sqrt{(x-x_1)^2 + (y-y_A)^2 + z_1^2} + \sqrt{(x-x_3)^2 + (y-y_B)^2 + z_3^2} - \sqrt{x_1^2 + y_1^2 + z_1^2} - \sqrt{x_3^2 + y_3^2 + z_3^2} = m\lambda/2 \quad (5)$$

wherein
$y_A = y_1 + |(z_2-z_1)/z_2|y$
$y_B = y_3 + |(z_4-z_3)/z_4|y$
$(z_1/y_1 = z_2/y_2)$
$(z_3/y_3 = z_4/y_4)$
$x_A = x_1 + |(z_2-z_1)/z_2|x$
$x_B = x_3 + |(z_4-z_3)/z_4|x$ Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (4) and (5), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask M, and that the line and space ratio of rectangular grating is 1:1 in the case of the grating lens on the wafer W. FIG. 11 exemplifies such a grating lens pattern having been designed in the described manner.

As a specific example, a grating lens on a mask M was formed by transferring, onto an organic thin film of polyimide, a grating lens pattern of a reticle prepared by use of electron beam exposure technique.

On the other hand, a mark on a wafer W was formed by preparing on a mask a pattern to be printed on a wafer and then by transferring the pattern by use of a lithographic process.

However, the method of forming a grating lens is not limited thereto.

In the present embodiment, the lens power in the scribe line direction is made large and, as a result, a larger number of gratings can be defined. This ensures good light collection efficiency as a grating lens, which is significantly improved as compared with that attainable with an arrangement in which a grating lens has a lens power in the widthwise direction of the scribe line for detection of positional deviation.

Further, in regard to a direction perpendicular to the deviation detecting direction, the magnification is suppressed to be small such as "×5", for example, and such an alignment mark as having a relatively long focal length is used. As a consequence, the amount of scattered light component or unwanted diffraction light component on a sensor can be reduced. Also, even if there occurs a positional error of an amount about 20 microns in the direction perpendicular to the position detecting direction, failure of reception of light by the sensor does not result.

Further, the diameter of an alignment light upon the sensor, when evaluated with respect to the magnitude at which $1/e^2$ is defined in regard to the peak level, is restricted to a maximum of 400 microns. As a result, the quantity of light per unit area on the sensor increases which improves the signal-to-noise ratio of sensor signals. Therefore, the positional deviation detecting precision can be improved significantly, as compared with a case wherein no lens function is provided in a direction perpendicular to the deviation detecting direction.

The foregoing embodiments adopt such alignment mark disposition according to which correct alignment (with no positional deviation) is discriminated when an alignment mark of a wafer is positioned exactly underneath an alignment mark of a mask. However, the present invention is not limited to this, but alignment marks may be provided on a mask and a wafer with a mutual shift in a direction perpendicular to the direction with respect to which any positional deviation should be detected. For example, where as in the fourth embodiment shown in FIG. 9 any relative positional deviation between a mask and a wafer with respect to the direction of a scribe line on the mask (i.e. x-axis direction) is to be detected, the alignment mark for the wafer may be provided with its widthwise direction shifted in the y-axis direction, wherein a scribe line is set in the x-axis direction. When the position of an alignment mark of a wafer is defined in this manner, it is possible to reduce the angle of incidence upon the mask surface of a light from an alignment head, and to make the grating pitch larger than the wavelength (e.g. $\lambda=0.83$ micron) of a used alignment light, for example. Therefore, the preparation of alignment marks is facilitated.

Figure 12A:
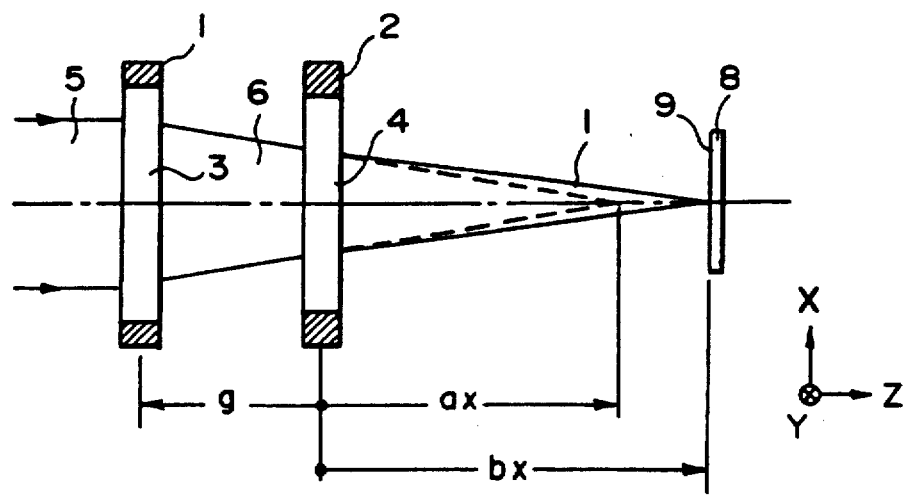
FIGS. 12A and 12B are schematic representations, respectively, for explicating a sixth embodiment of the present invention.
Figure 12B:
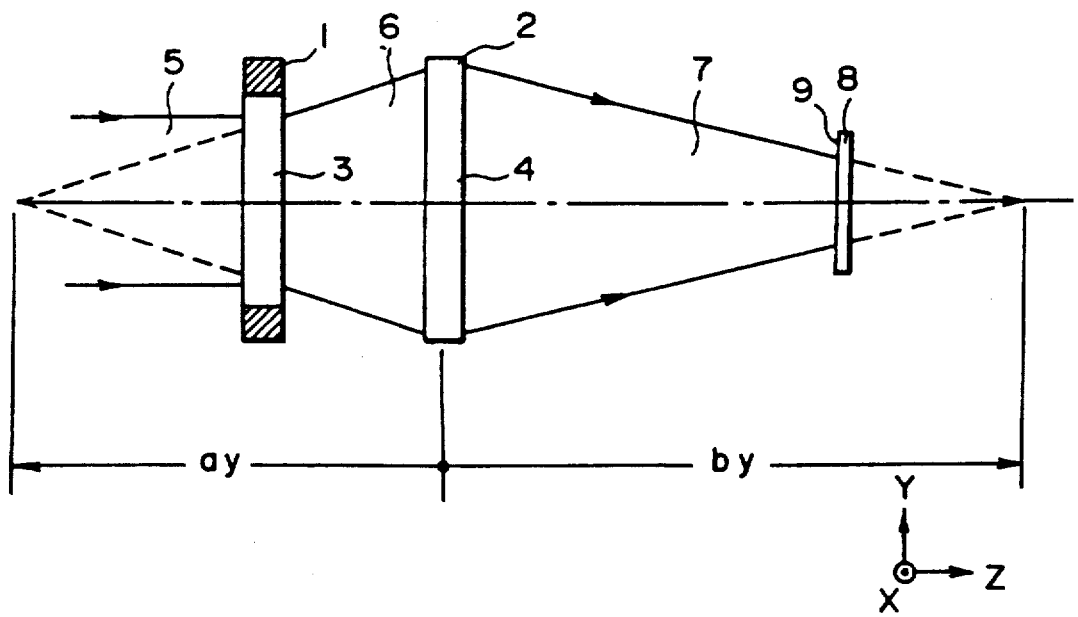

Referring to FIGS. 12A and 12B, a description will be provided of a sixth embodiment of the present invention. FIG. 12A is a view taken on an x-z plane, and FIG. 12B is a view taken on a y-z plane. The position detecting system according to this embodiment includes two physical optic elements of different grating lens power arrangements in respect to a direction (x-axis direction) in which any positional deviation should be detected and a direction (y-axis direction) perpendicular to the deviation detecting direction.

More specifically, in this embodiment, a first physical optic element 3 has a concave lens function having a focal length $a_x+g$ with respect to the deviation detecting direction (x-axis direction), whereas with respect to the direction (y-axis direction) perpendicular to the deviation detecting direction it has a concave lens function having a focal length $-(a_y-g)$. On the other hand, a second physical optic element 4 has a concave lens function having a focal length $-f_x$, satisfying a relation "$-(1/a_x)+(1/b_x)=-(1/f_x)$" with respect to the deviation detecting direction, whereas with respect to the y-axis direction it has a convex lens function having a focal length $f_y$, satisfying a relation "$(1/a_y)+(1/b_y)=(1/f_y)$".

If, in this example, the gap is small as compared with the aperture and if, as in a mark to be provided on a scribe line upon a mask or wafer usable in a semiconductor device manufacturing exposure apparatus, the aperture diameter can be made large in the direction of the scribe line but can not be made large in a direction perpendicular thereto, such a combination of physical optic elements may suitably be selected in which there are provided lens functions that: in the scribe line direction, a concave lens power (first physical optic element) and a convex lens power (second physical optic element) are provided, while in the widthwise direction of the scribe line a convex lens power (first physical optic element) and a concave lens power (second physical optic element) are provided.

Namely, depending on the direction with respect to which any positional deviation should be detected (i.e., depending on whether the positional deviation should be detected with respect to the lengthwise direction of a scribe line or with respect to the widthwise direction thereof), a suitable combination of a concave lens power and a convex lens power can be selected in each of these directions.

In FIGS. 12A and 12B, the first and second physical optic elements are illustrated each as being a transmission type physical optic element. If, however, the invention is applied to a semiconductor device manufacturing exposure apparatus, preferably the second physical optic element to be provided on a wafer may comprise a reflection type physical optic element. As an example, for such a proximity type exposure apparatus wherein each alignment mark has a size of 250 microns in the lengthwise direction of a scribe line and 60 microns in the widthwise direction of the scribe line and where the mask-to-wafer gap is 30 microns, the system may preferably designed so that, with respect to the lengthwise direction of the scribe line, a lens element of the mask has a concave lens power to focal length $-268$ microns and a lens element of the wafer has a convex lens power of focal length 279 microns; whereas, with respect to the widthwise direction of the scribe line, the lens of the mask has a concave lens power of focal length 3.0 mm and the lens element of the wafer has a concave lens power of focal length $-3.2$ mm.

Figure 13:
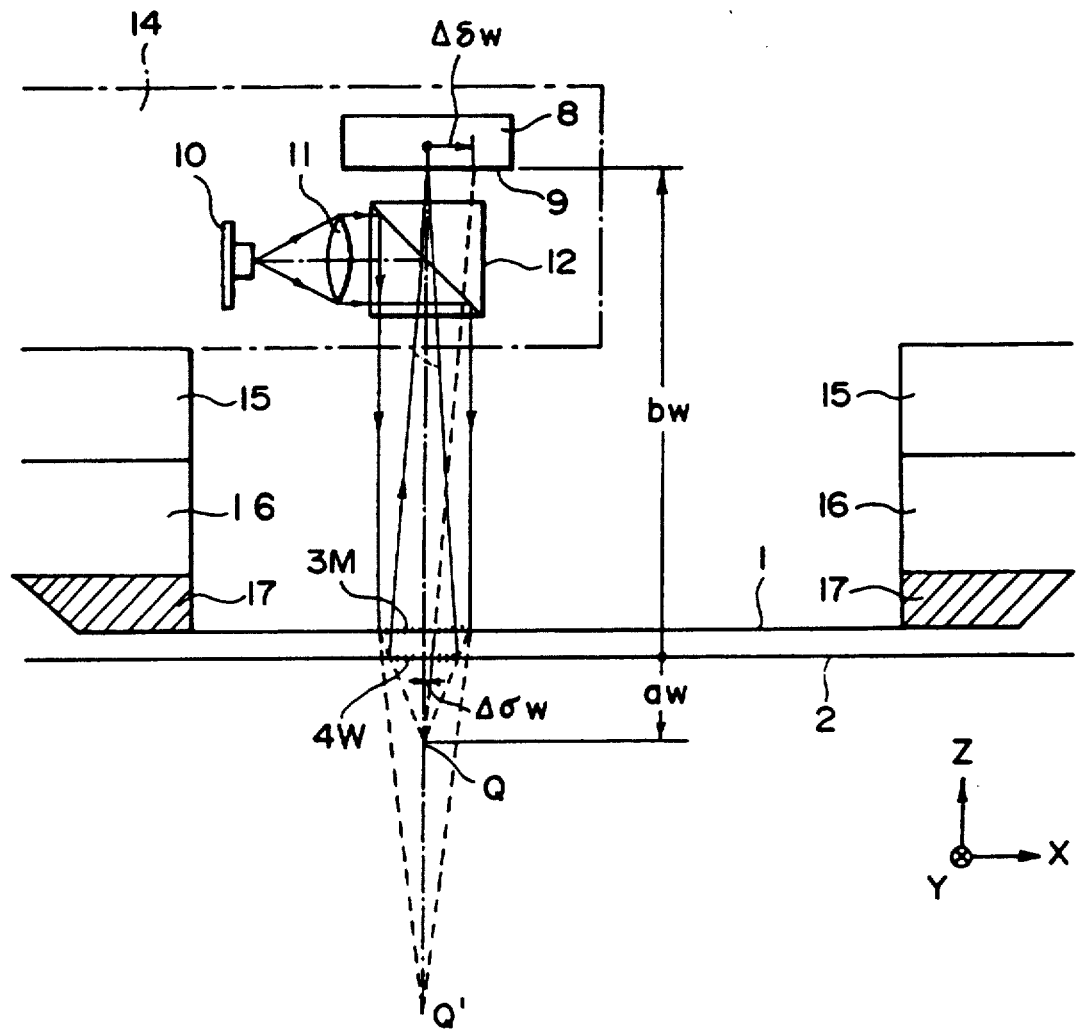
FIG. 13 is a schematic representation, showing an optical arrangement of a position detecting system according to a seventh embodiment of the present invention.

Referring now to FIG. 13, a seventh embodiment of the present invention will be explained. This embodiment uses alignment marks which cooperate to provide what can be called a "convex-concave system" having a convex lens and a convex-surface mirror. Mask M is attached to a membrane 17 which is supported through a mask chuck 16 by a stationary portion of an exposure apparatus, not shown. Disposed above the stationary portion 15 is an alignment head 14 for executing mask-to-wafer alignment. Also, for alignment of the mask M and a wafer W, mask alignment pattern 3M and a wafer alignment pattern 4W are formed in portions of the mask M and the wafer W, respectively.

Light emanating from a light source 10 is collimated into a parallel light by a light projecting lens system 11 and, after passing a half mirror 12, it impinges on the mask alignment pattern 3M. In this example, the alignment pattern 3M is provided by a transmission type zone plate which has a convex lens function for focusing a received light at a point Q, in an x-z plane. The wafer alignment pattern 4W comprises a reflection type zone plate and has a convex-surface mirror function for imaging, in the x-z plane and upon a detecting surface 9, the light once converged at the point Q.

In such arrangement as described, a positional deviation $\Delta\sigma_w$ of the wafer W in the x direction and relative to the mask M, causes displacement $\Delta\delta_w$ of the center of gravity of light impinging on the detecting surface 9, which displacement can be expressed by:

$$\Delta\delta_w = \Delta\sigma_w(b_w/a_w+1)$$

In regard to the y-z plane, the action is essentially the same as in the FIG. 9 embodiment.

FIGS. 14A and 14B show an eighth embodiment of the present invention, wherein FIG. 14A is a view taken on an x-z plane, while FIG. 14B is a view taken on a y-z plane. In this embodiment, a first object 1 is provided with a grating lens 103M which can function in the x-z plane as a convex lens having a focal length $f_{1x}(>0)$ for focusing a received light 5 at a point Q, but it can function in the y-z plane as a concave lens having a focal length $f_{1y}(<0)$ for divergingly emitting the received light. On the other hand, a second object 2 is provided with a grating lens 104W which can function as a toric lens having different focal lengths in the x-z plane and y-z plane which are set so that, in both of the x-z plane and the y-z plane, light 6 divergingly emanating from different origins of divergence, located at different distances in these planes, and impinging on the grating lens 104W is collected (as a signal light 7) just upon a detecting surface 9. Reference character g denotes the gap between the first and second objects, and reference character b denotes the distance to the detecting surface 9 from the grating lens 104W. By the action of the grating lens 104W, the light 7 is best collected upon the detecting surface 9, in both of the x-z plane and the y-z plane, to form a spot. Therefore, the efficiency of light reception in regard to the signal light is very high.

In the x-z plane, for enhanced sensitivity of detection of any relative deviation of the first and second objects 1 and 2, the arrangement of this embodiment is such as to provide an enlarging system in which the grating lens 104W provides a large imaging magnification, imaging the focus Q upon the detecting surface 9. That is, $b>>a_x$ is satisfied. Also, in this embodiment, the relationship of equation (1) discussed in the foregoing is satisfied.

Thus, if the magnification determined by the term "$b/a_x+1$" in the right side of equation (1) is 100, for example, then a relative positional deviation $\Delta\sigma_x$ between the first and second objects 1 and 2 in the x-axis direction, even if it is so small to an order of 0.01 micron, can be detected as a displacement of the light spot through 1 micron on the detecting surface 9. In this manner, any deviation of the second object in the x-axis direction can be detected with high precision. The manner of deviation detection is essentially the same as described in the foregoing.

On the other hand, in regard to the y-z plane which is orthogonal to the x-z plane, where the shift of the second object 2 in the y-axis direction is denoted by $\Delta\sigma_y$ and a corresponding displacement of the light spot upon the detecting surface 9 in the y-axis direction is denoted by $\Delta\delta_y$, then similarly there is a relationship such as follows:

$$\Delta\delta_y = (1 + b/a_y)\cdot\Delta\sigma_y \tag{6}$$

$a_y$ is the distance from origin of divergence of the light from the grating lens 103M to grating lens 104W. If, in the illustrated state, the value of $a_y$ is made equal to that of the distance b, it follows that $\Delta\delta_y = 2\Delta\sigma_y$. Thus, even if the shift of the second object 2 is large, of an order of 10 microns, for example, the displacement of the light spot upon the detecting surface 9 can be small of an order of 20 microns. It is seen therefrom that, in this embodiment also, the possibility of failure of impingement of the light 7 upon the detecting surface 9 is very small.

If, in equation (6), $a_y = \infty$ (this means that the first physical optic element has no power in the y-z plane), then from equation (6) it follows that $\Delta\delta_y = \Delta\sigma_y$. Thus, it is seen that the structure can be such that allows further reduction of $\Delta\delta_y$, for certain $\Delta\delta_y$. Such structure corresponds to an arrangement wherein the grating lens of the first object 1 functions as a so-called cylindrical lens having no power in the y-z plane. An example of this arrangement is illustrated in FIGS. 15A and 15B, as a ninth embodiment.

Figure 15A:
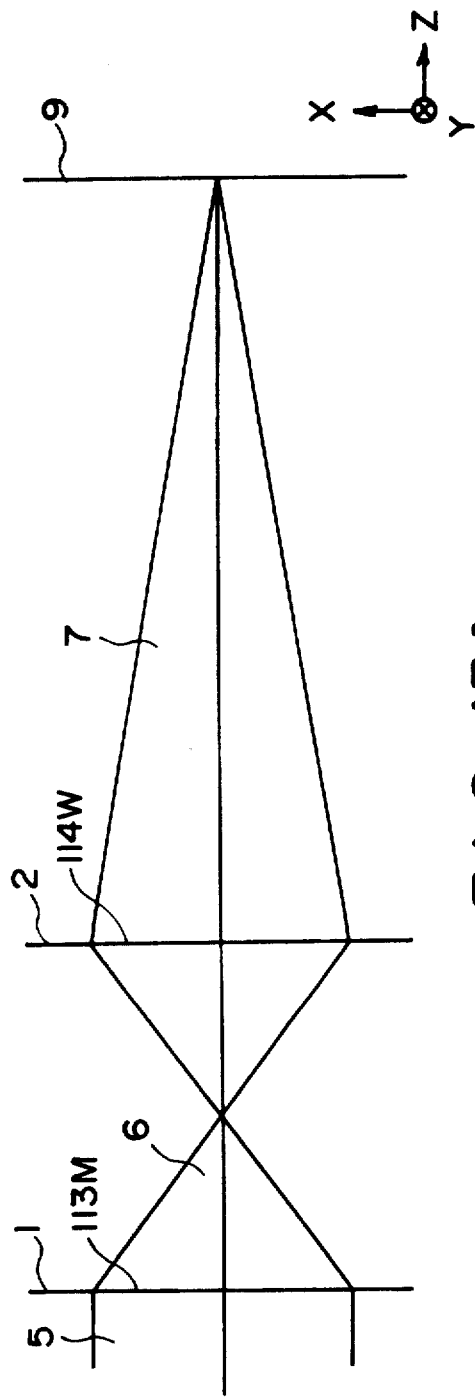
FIGS. 15A and 15B are schematic representations, respectively, for explicating a ninth embodiment of the present invention.
Figure 15B:
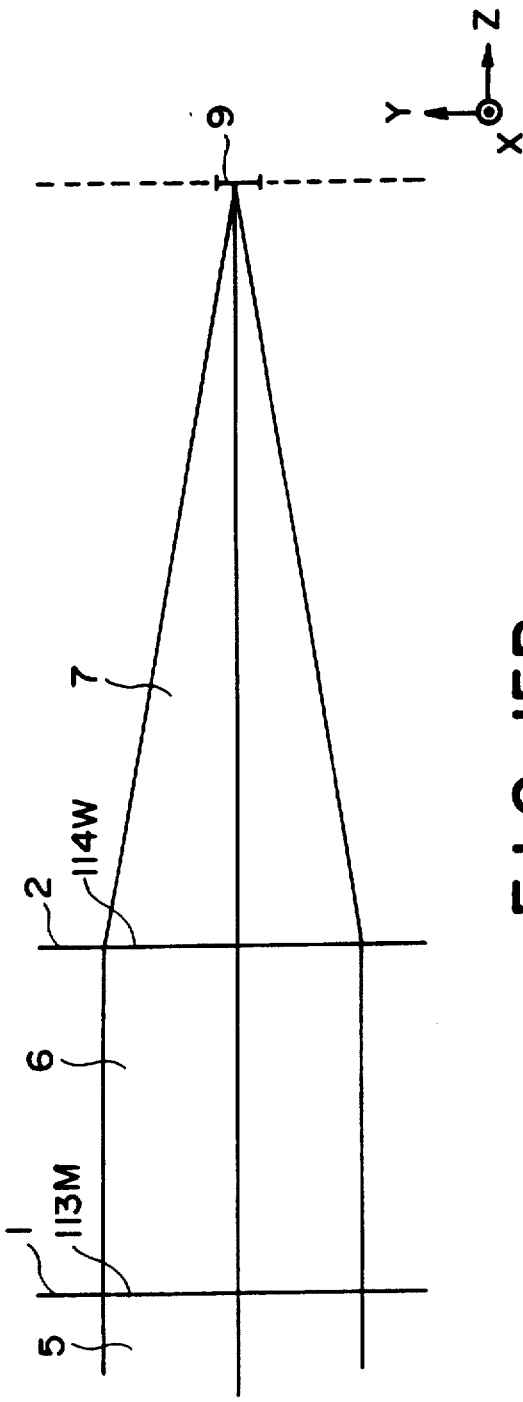

FIG. 15A is a view taken on an x-z plane, and FIG. 15B is a view taken on a y-z plane. Denoted in these figures at 113M and 114W are grating lenses having functions like those of the grating lenses 103M and 104W shown in FIGS. 14A and 14B. However, as described, the grating lens 113M of this embodiment has neither a light converging function nor a light diverging function in the y-z plane. Also, the grating lens 114W is operable to transform a received light 6, having been incident thereupon with being neither converged nor diverged in the y-z plane, into a light 7 which is to be collected upon a detecting surface 9. In this example, as described above, the magnitude of $\Delta\delta_y$ is at the maximum equal to or substantially equal to $\Delta\sigma_y$. Thus, even if the position of the second object 2 in the y-axis direction changes, there occurs no or substantially no displacement of the spot of light 7 upon the detecting surface 9 in the y-axis direction. Therefore, there is no or substantially no necessity of taking into account the possibility of shift of the light 7 in the y-axis direction, outwardly of the detecting surface 9. Further, since the light 7 is collected upon the detecting surface 9 both in the x-z plane and in the y-z plane, the efficiency of light reception is good.

In this embodiment, the pattern of the grating lens 113M can be determined in the following manner, using the center of the grating lens 113M as an origin:

$$y\sin\theta_1 + P_1(x) - P_2 = m\lambda/2$$

$$P_1(x) = [(x - x_1)^2 + z_1^2]^{\frac{1}{2}}$$

$$P_2 = [x_1^2 + z_1^2]^{1/2}$$

wherein $\lambda$ is the wavelength of a used light and m is an arbitrary integral number. The symbol $P_2$ denotes the distance from the origin to the point of convergence, in the x-z plane, of light by the grating lens 113M, and the coordinate of such point of convergence can be represented by $(x_1, y_A, z_1)$. The symbol $\theta_1$ denotes the angle of incidence of the light 5, and g denotes the gap between the first and second objects.

Next, the pattern of the grating lens 114W will be explained. Similarly, the center of the lens 114W is used as an origin.

The position of each point on a linear light source that produces a cylindrical wave can be expressed by $(x_1, y_A, z_1 - g)$ wherein g is the gap between the mask M and the wafer W and wherein $x_1$ and $z_1$ are constants. The position of convergence of the light emanating from the wafer grating lens can be denoted by $(x_3, y_B, z_3)$ in the x-axis direction and $(x_B, y_4, z_4)$ in the y-axis direction. Here, $x_B$ and $y_B$ represent those positions at which the light, inputted to the wafer grating lens at a position (x, y, −g) and being diffracted by first-order diffraction, for example, reaches the planes of $z = z_3$ and $z = z_4$. Equation of pattern designing in this occasion is expressed as follows:

$$\sqrt{(x - x_3)^2 + (y - y_B)^2 + z_3^2} + \tag{7}$$

$$\sqrt{(x - x_1)^2 + (z_1 - g)^2} -$$

$$[\sqrt{x_3^2 + y_3^2 + z_3^2} + \sqrt{x_1^2 + (z_1 - g)^2}] = m\lambda/2$$

wherein $\lambda$ and m each has the same definition as in the foregoing equation, and $z_3 \neq 0$ and $z_4 \neq 0$. Also, $$y_B = y_3 + |(z_4 - z_3)/z_4|y$$

and $$x_B = x_3 + |(z_4 - z_3)/z_4|x$$

wherein $$z_3/y_3 = z_4/y_4$$

In this embodiment, $z_3 = z_4$. From this, it follows that:
$y_B = y_3$ and $x_B = x_3$
Therefore, equation (7) can be expressed as follows:

$$\sqrt{(x - x_3)^2 + (y - y_3)^2 + z_3^2} +$$

$$\sqrt{(x - x_1)^2 + (z_1 - g)^2} -$$

$$[\sqrt{x_3^2 + y_3^2 + z_3^2} + \sqrt{x_1^2 + (z_1 - g)^2}] = m\lambda/2$$

This represents the pattern of the grating lens 114W.

Figure 16A:
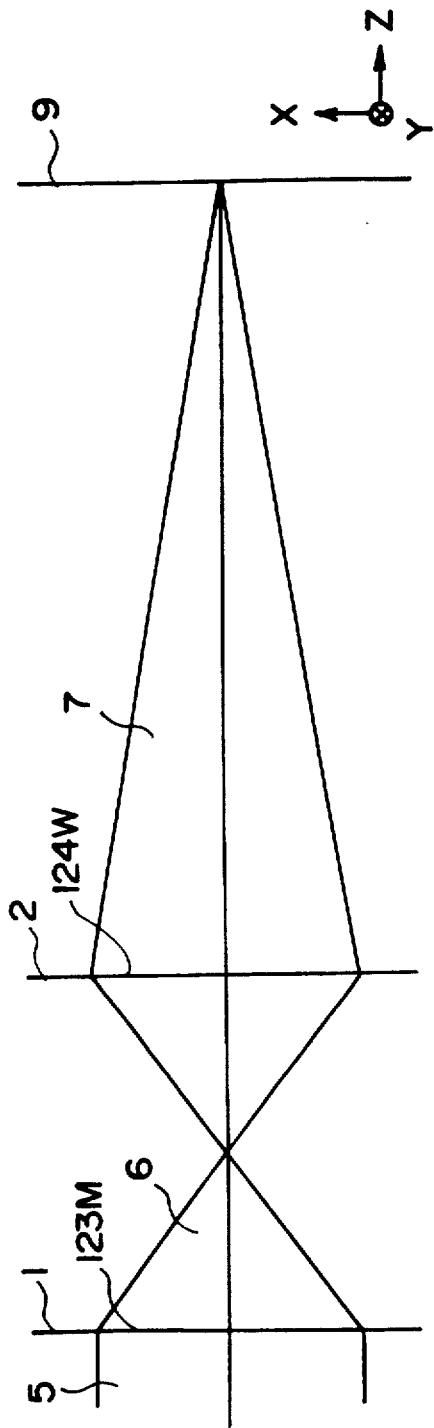
FIGS. 16A and 16B are schematic representations, respectively, for explicating a tenth embodiment of the present invention.
Figure 16B:
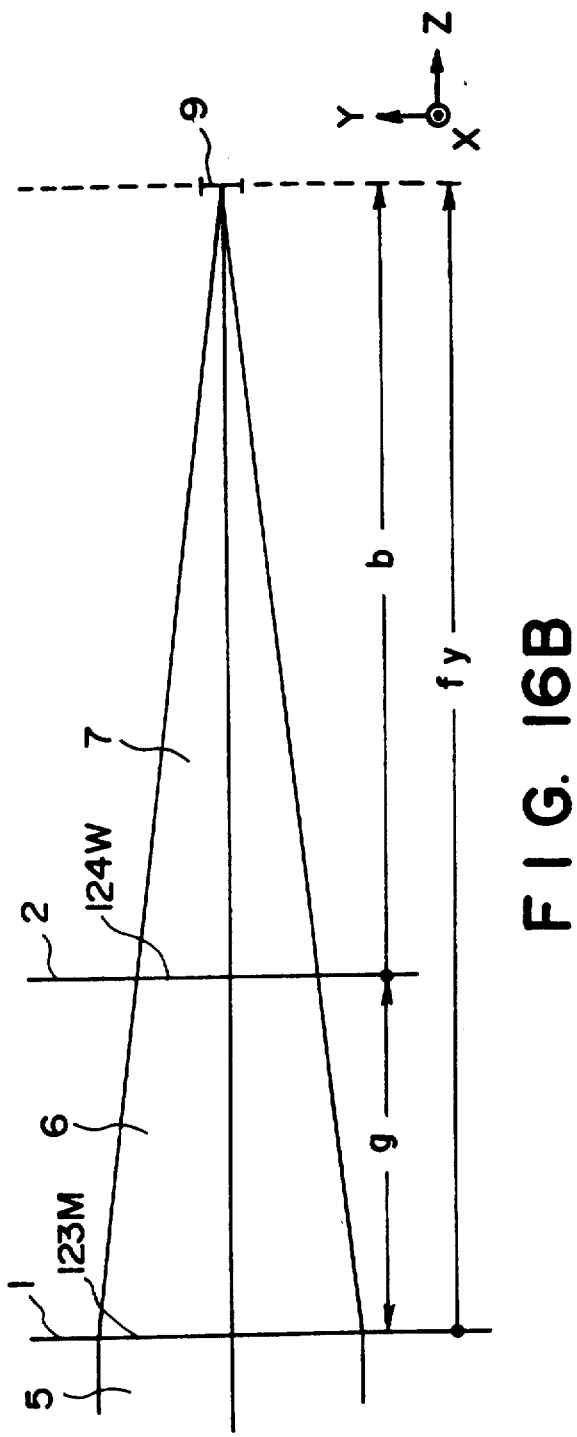

FIGS. 16A and 16B show a tenth embodiment of the present invention, wherein FIG. 16A is a view taken on an x-z plane and FIG. 16B is as view taken on a y-z plane.

If in equation (6) a relationship $-a_y = b$ is satisfied, the right side becomes equal to zero, such that $\Delta\delta_y$ for an arbitrary $\Delta\sigma_y$ becomes equal to zero. Namely, even if a second object 2 displaces in the y-axis direction, a spot of light upon a detecting surface 9 does not at all displace, regardless of the focal length of a grating lens 124W in the y-z plane. This is illustrated in FIGS. 16A and 16B. Grating lenses 123M and 124W used in this embodiment have the same optical functions (light collecting functions) in the x-z plane as those of the grating lenses 103M and 104W of the FIG. 14 example. In this y-z plane, the grating lens 124W has no power and it functions as a cylindrical lens. On the other hand, the grating lens 123M can function in the y-z plane as a convex lens having a focal length $f_y$ in that plane, wherein $f_y = g + b$. If, in this state, the second object displaces in the y-axis direction as in the example described before, the spot on the detecting surface does not displace in the y-axis direction. Since the light is best collected upon the detecting surface, the efficiency of light reception is good. This is the same as in the embodiment of FIGS. 15A and 15B. The grating lens 124W may, of course, have a power for partially collecting a received light.

The pattern of a grating lens 123M usable in this embodiment will be explained. Using the center of the grating lens 123M as an origin, it is assumed that a parallel light is incident at an arbitrary point (x, y, 0) upon a first object at an angle $\alpha$, within the y-z plane, with respect to a normal to the surface of the first object, with its projection component being coincident with the y-axis direction; and that the alignment mark 123M has a focal length $z_1$ in the x-z plane and a focal length $z_2$ ($z_1 \neq z_2$) in the y-z plane. Equations regarding a group of curved lines of such a grating lens pattern (x, y) by which an inputted parallel light, after being transmissively diffracted by the alignment mark 3M, is collected in the x-z plane at a position ($x_1$, $y_A$, $z_1$) (wherein $x_1$ and $z_1$ are constants) whereas it is collected in the y-z plane at a position ($x_A$, $y_2$, $z_2$) (wherein $y_2$ and $z_2$ are constants), can be expressed as follows:

$$y \sin\alpha + P_1(x,y) - P_2(y) = m\lambda/2$$

$$P_1(x,y) = \sqrt{(x - x_1)^2 + (y - y_A)^2 + z_1^2}$$

$$P_2(y) = \sqrt{x_1^2 + y_1^2 + z_1^2}$$

$$y_A = y_1 + |(z_2 - z_1)/z_2| y$$

$$x_A = x_1 + |(z_2 - z_1)/z_2| x$$

$$z_1/y_1 = z_2/y_2 \quad (z_1 \neq 0, z_2 \neq 0)$$

wherein $\lambda$ is the wavelength. When the total number of zones is denoted by n, then m is an integral number which is in the range of 1 to 2n.

On the other hand, a grating lens 124W for the second object may be set as follows:

Where a set distance between the first and second objects 1 and 2 is denoted by g and when the center of the lens 124W is used as an origin, since an object point to the grating lens 124W can be denoted by ($x_1$, $y_A$, $z_1 - g$), the pattern can be determined in accordance with the following equation:

$$[(x - x_2)^2 + z_2^2]^{\frac{1}{2}} - [(x - x_1)^2 + (z_1 - g)^2]^{\frac{1}{2}} + y \sin\theta_2 =$$
$$[x_2^2 + z_2^2]^{\frac{1}{2}} - [x_1^2 + z_1^2]^{\frac{1}{2}} + m\lambda/2$$

Here, the coordinate of an image point on the photodetector 9, when no positional deviation exists, is represented by ($x_2$, $y_A$, $z_2$).

The light just impinging on the grating lens 124W has already been converged in the y-z plane by the grating lens 123M and, as a result, the emanating light 7 is focused at the position ($x_2$, $y_2$, $z_2$). The symbol $\theta_2$ depicts the angle of emission of a chief ray from the lens 124W within the y-z plane.

FIGS. 17A and 17B show an eleventh embodiment of the present invention, wherein FIG. 17A is a view taken on an x-z plane and FIG. 17B is a view taken on a y-z plane.

Where a light source as having astigmatism, such as a semiconductor laser, for example, is used as a light source, there is a possibility that light 5 emanating from such a light source and just going to be incident on a grating lens 133M has different states of convergence/divergence in the x-z plane and in the y-z plane, and in these planes different object distances Sx and Sy are defined to the grating lens (first physical optic element) 133M. In this embodiment, the powers of grating lenses 133M and 134W in the x-z plane and y-z plane are adjusted so that, in both of these planes, light is converged upon the detecting surface 9 to thereby form a light spot thereupon. Thus, by providing a grating lens with a toric lens function, it is possible to ensure high-precision position detection even with use of light of a light source as having astigmatism.

In accordance with some embodiments described hereinbefore, first and second objects to be aligned with each other are provided with grating lens elements, as the relative deviation detecting alignment marks, at least one of which has a particular lens function with respect to the direction of deviation detection and which has a different lens function having a different focal length with respect to a direction perpendicular to the deviation detecting direction. This effectively prevents failure of impingement of an alignment light upon a sensor if the two objects are mutually deviated in the direction perpendicular to the deviation detecting direction, which failure results in failure of detection of the deviation. Also, it is possible to reduce reception of an unwanted diffraction light component or scattered light component, other than an alignment signal light. As a result, it is possible to accomplish a position detecting method and apparatus or an alignment method and apparatus by which high-precision alignment is attainable.

While the foregoing description has been provided of a method and apparatus for detecting the relative position of a first object (mask) and a second object (wafer) in a direction perpendicular to the direction in which they are opposed to each other, as a matter of course the invention is applicable also to a method and apparatus for measuring the gap or interval between these objects.

Referring to FIGS. 18A and 18B, such an example will be explained. FIG. 18A is a view taken on an x-z plane, and FIG. 18B is a view taken on a y-z plane.

Denoted in these Figures at 101 is a laser beam supplied from an unshown light source such as a semiconductor laser. The semiconductor laser may be replaced by a different type of laser device such as a He-Ne laser, for example. Denoted at 102 is a first object which is a mask, for example. Denoted at 103 is a second object which is a wafer, for example. The second object when it is at a position P1 is depicted by a solid line, while it is depicted by a broken line when the same is at a position P2. Denoted at 104 and 105 are a first and second physical optic elements which are provided in a portion of the mask 102. Each of these physical optic elements 104 and 105 is provided by a diffraction grating or zone plate, for example.

Denoted at 108 is a light receiving means which comprises a line sensor, PSD or otherwise and functions to detect the position of the center of gravity of a received light. Denoted at 109 is a signal processing circuit which is operable to determine, by using signals from the light receiving means 108, the position of the center of gravity of the light incident on the light receiving means 108, and to detect by calculation a gap $d_0$ between the mask 2 and the wafer 3 in a manner which will be described later.

The light 101 (wavelength $\lambda = 830$ nm in this example) from the semiconductor laser is perpendicularly incident at a point A on the surface of a first Fresnel zone plate provided in a portion of the mask 102. The light incident on the first Fresnel zone plate 104 is diffracted thereby, and diffraction light of a predetermined order or orders, being diffracted at an angle $\theta_1$ is reflected at a point B (C) on the wafer 103 surface. Reference numeral 131 denotes such a reflection light from the wafer 103 when it is at a position P1 which is at a distance (interval) $d_0$ from the mask 102. Reference numeral 132 denotes such a reflection light from the wafer 103 when it is at a position P2 which is at a distance $d_G$ from the position P1.

The reflected light from the wafer 103 is incident at a point D (or E as the wafer 103 is at the position P2) on the surface of a second Fresnel zone plate 105 provided in a portion of the first object (mask) 102.

The second Fresnel zone plate 105 has an optical function by which the angle of emission of a diffraction light emanating therefrom changes in accordance with the position of incidence of light impinging on the second Fresnel zone plate, like a function of a condensing lens. The second Fresnel zone plate 105 has a focal length $f_{Mx}$ in the x-z plane.

Diffraction light 161 (or 162 as the wafer 103 is at the position P2) of a predetermined order or orders, being diffracted from the second Fresnel zone plate 105, is directed through the condensing lens 200 onto the surface of the light receiving means 108. By using the position of the center of gravity of the received light 161 (or 162) on the surface of the light receiving means 108, the gap or interval between the mask 102 and the wafer 103 can be detected by calculation.

In this embodiment, the first Fresnel zone plate 104 has a function simply for deflecting a received light. However, it may have a light converging or diverging function.

The manner of calculation will be explained in detail. Where the distance to the light receiving means from the focal point position of the second Fresnel zone plate 5 is denoted by a, the distance to the position of an image point (imaginary point) 108' defined through the condensing lens 200 from the same lens is denoted by b, and the distance to the light receiving means 108 from that image point position 108' is denoted by c, then the amount of shift S of the light spot incident on the surface of the light receiving means 108, as the gap between the mask and the wafer changes from $d_0$ to $d_G$, is given by the following equation:

$$S = 2d_G \tan\theta_1 (a \cdot c / f_{Mx} b)$$

In this equation, the values of $\theta_1$, a, b, c and $f_{Mx}$ can be detected in preparation. Therefore, by detecting shift or deviation S of the light spot by using the light receiving means, the distance $d_G$ can be detected in accordance with the above equation. By using the detected value $d_G$, it is possible to detect an error in the wafer 103 position with respect to a reference position (P1) which is at a predetermined or desired interval with respect to the mask 102, to thereby measure an actual interval between the mask 102 and the wafer 103. At this time, by selecting larger values for a, c and $\theta_1$, a large deviation S can result from $d_G$. Namely, a minute change in the gap can be transformed into a magnified displacement of a light spot and, therefore, it can be detected with high precision.

The position of incidence upon the light receiving means 108 of the light from the second Fresnel zone plate 105, as the wafer 103 is at a desired interval $d_0$, is used as a reference position as seen from the foregoing description. Such a reference position can be easily determined in preparation. For example, a suitable means may be used to set a wafer exactly at a predetermined interval ($d_0$) from a mask, and light may be projected from the light source. Thus, such a position on the light receiving means 108 at which the light from the second Fresnel zone plate 105 impinges may be determined as the reference position. As an example, for the setting of the wafer, a measuring apparatus "TM-230N" (trade name; manufactured by Canon Inc. Japan) may be conveniently used.

In this embodiment, as described, a signal related to displacement or deviation of a light spot within the x-z plane is used to determine the distance $d_G$. On the other hand, in a plane perpendicular to the x-z plane, namely in the y-z plane, the physical optic element 105 as a characteristic thereof has a focal length $f_{My}$ which is different from the focal length $f_{Mx}$ thereof in the x-z plane. This provides the following advantages. That is, by setting such focal length $f_{My}$ by which the light from the second physical optic element 105 is once focused, in the y-z plane, and then under the influence of the same condensing lens 200 it is focused or collected again upon the light receiving means 108. Thus, it is possible to concentrate the light upon the light receiving means 108 in a direction (y-axis direction) perpendicular to the direction (x-axis direction) in which the light spot displaces. Therefore, the necessary size for the effective sensing portion of the light receiving means 108 can be reduced and, as a result, the electric noise level as well as the probability of reception of unwanted light (stray light) can be reduced. Thus, the signal-to-noise ratio can be improved significantly.

It will be understood that the first physical optic element (Fresnel zone plate) 104 may be omitted and, in that case, light 101 may be projected from an unshown light source upon the mask 102 with inclination of an angle $\theta_1$. The gap measurement is attainable also in that case. Further, in place of simple reflection of light at the wafer 103 surface, a diffraction grating may be provided in that portion of the wafer 103, so that light is diffracted by this diffraction grating toward the second physical optic element (Fresnel zone plate 105).

While the invention has been described with reference to the structures disclosed herein, it is not confined to the details set forth and this application is intended to cover such modifications or changes as may come within the purposes of the improvements or the scope of the following claims.

What is claimed is:

1. A device for detecting a relative positional relationship between first and second objects with respect to a predetermined direction, comprising:
   illumination means for irradiating the first object with light;
   wherein the first and second objects are provided with first and second physical optic elements, respectively, each having a light converging or diverging function in said predetermined direction and wherein said illumination means illuminates the first physical optic element; and
   photodetecting means for detecting light passing through the first object and emanating from the second object, wherein said photodetecting means is operable to detect light convergently or divergently influenced by both of the first and second physical optic elements, such that the relative positional relationship between the first and second objects can be detected on the basis of the detection by said photodetecting means;
   wherein at least one of the first and second physical optic elements has a light converging or diverging function also in a direction perpendicular to said predetermined direction and has different focal lengths in said perpendicular direction and in said predetermined direction.

2. A device for detecting a relative positional relationship between first and second objects with respect to a predetermined direction, comprising:
   illuminating means for irradiating the first object with light;
   wherein the first and second objects are provided with first and second physical optic elements, respectively, each having a light converging or diverging function in said predetermined direction and wherein said illumination means illuminates the first physical optic element; and
   photodetecting means for detecting light passing through the first object and emanating from the second object, wherein said photodetecting means is operable to detect light convergently or divergently influenced by both of the first and second physical optic elements, such that the relative positional relationship between the first and second objects can be detected on the basis of the detection by said photodetecting means;
   wherein one of the first and second physical optic elements has a light converging or diverging function also in a direction perpendicular to said predetermined direction and has different focal lengths in said perpendicular direction and in said predetermined direction, and wherein the other of the first and second physical optic elements has no light converging function and no light diverging function in a direction perpendicular to said predetermined direction.

3. A method of detecting a relative positional relationship between first and second objects with respect to a predetermined direction, comprising:
   a first step for providing the first object with a first physical optic element having a light converging or diverging function in said predetermined direction;
   a second step for providing the second object with a second physical optic element having a light converging or diverging function in said predetermined direction;
   a third step for irradiating the first physical optic element with light;
   a fourth step for detecting light having been convergently or divergently influenced by the first physical optic element, having been inputted into the second physical optic element and having been convergently or divergently influenced by the second physical optic element; and
   a fifth step for detecting the relative positional relationship between the first and second objects on the basis of the detection at said fourth step;
   wherein at least one of the first and second physical optic elements has a light converging or diverging function also in a direction perpendicular to said predetermined direction and has different focal lengths in said perpendicular direction and in said predetermined direction.

4. A method of detecting a relative positional relationship between first and second objects with respect to a predetermined direction, comprising:
   a first step for providing the first object with a first physical optic element having a light converging or diverging function in said predetermined direction;
   a second step for providing the second object with a second physical optic element having a light converging or diverging function in said predetermined direction;
   a third step for irradiating the first physical optic element with light;
   a fourth step for detecting light having been convergently or divergently influenced by the first physical optic element, having been incident upon the second physical optic element, and having been convergently or divergently influenced by the second physical optic element; and
   a fifth step for detecting the relative positional relationship between the first and second objects on the basis of the detection at said fourth step;
   wherein one of the first and second physical optic elements has a light converging or diverging function also in a direction perpendicular to said predetermined direction and has different focal lengths in said perpendicular direction and in said predetermined direction, and wherein the other of the first and second physical optic elements has no light converging function and no light diverging function in a direction perpendicular to said predetermined direction.

5. An alignment mark with an optical power, wherein said mark has a non-zero optical power with respect to each of a first direction and a second direction which is substantially perpendicular to the first direction, and wherein said mark has different focal lengths with respect to the first and second directions.

6. An alignment mark with an optical power, wherein said mark comprises a zone plate having a non-zero optical power with respect to each of a first direction and a second direction which is substantially perpendicular to the first direction, and wherein said zone plate has different focal lengths with respect to the first and second directions.

7. A method of detecting the position of a substrate, comprising the steps of:
   providing the substrate with a mark having a non-zero optical power with respect to each of a first direction and a second direction substantially perpendicular to the first direction, the mark further having different focal lengths with respect to the first and second directions;

supplying a radiation beam to the mark; and detecting any of the radiation beam from the mark to determine the position of the substrate with respect to the first direction.

8. A method according to claim 7, wherein the mark comprises a zone plate.

9. A method according to claim 7, further comprising the steps of receiving any of the radiation beam from the mark with a sensor and determining the position of the substrate on the basis of the position of the received radiation beam on the sensor.

10. A method according to claim 9, wherein the mark comprises a zone plate.

11. A method according to claim 9, wherein said determining step comprises the step of determining the position of the substrate by use of a signal produced by the sensor.

12. A method according to claim 11, wherein the mark comprises a zone plate.

13. A method according to claim 11, wherein said providing step comprises the step of providing a substrate with the mark, the focal length of which, with respect to the first direction, is such that any of the radiation beam from the mark is substantially focused upon a light receiving surface of the sensor in said receiving step.

14. A method of detecting the relative positional deviation between first and second objects, said method comprising the steps of:

providing the first object with a first alignment mark having different focal lengths with respect to a first direction and a second direction substantially perpendicular to the first direction, the first alignment mark having a non-zero optical power with respect to each of the first and second directions;

providing the second object with a second alignment mark having a non-zero optical power with respect to the first direction;

supplying a radiation beam to each of the first and second alignment marks; and detecting any of the radiation beam from the first and second alignment marks to determine the relative positional deviation between the first and second objects with respect to the first direction.

15. A method according to claim 14, wherein each of the first and second alignment marks comprises a zone plate.

16. A method according to claim 14, further comprising the steps of receiving the radiation beam from the first and second alignment marks with a sensor and determining the relative position of the first and second objects on the basis of the position of the received radiation beam on the sensor.

17. A method according to claim 16, wherein each of the first and second alignment marks comprises a zone plate.

18. A method according to claim 16, wherein said determining step comprises the step of determining the relative position of the first and second objects by use of a signal produced by the sensor.

19. A method according to claim 18, wherein each of the first and second alignment marks comprises a zone plate.

20. A method according to claim 18, wherein said providing step comprises the step of providing first and second objects with first and second alignment marks, respectively, the focal lengths of which are such that the radiation beam from the first and second alignment marks is substantially focused upon a light receiving surface of the sensor.

21. A method according to claim 20, wherein each of the first and second alignment marks comprises a zone plate.

22. A method according to claim 14, wherein said second object providing step comprises the step of providing a second object with the second alignment mark having a non-zero optical power with respect to each of the first and second directions.

23. A method according to claim 22, wherein each of the first and second alignment marks comprises a zone plate.

24. A method according to claim 22, further comprising the steps of receiving the radiation beam from the first and second alignment marks with a sensor and determining the relative position of the first and second objects on the basis of the position of the receiving radiation beam on the sensor.

25. A method according to claim 24, wherein each of the first and second alignment marks comprises a zone plate.

26. A method according to claim 24, wherein said determining step comprises the step of determining the relative position of the first and second objects by use of a signal produced by the sensor.

27. A method according to claim 26, wherein each of the first and second alignment marks comprises a zone plate.

28. A method according to claim 26, wherein said providing step comprises the step of providing first and second objects with first and second alignment marks, respectively, the focal lengths of which are such that the radiation beam from the first and second alignment marks is substantially focused upon a light receiving surface of the sensor.

29. A method according to claim 28, wherein each of the first and second alignment marks comprises a zone plate.

30. A method according to claim 22, wherein said detecting step comprises the step of detecting the radiation beam diverged by the first alignment mark with respect to the first direction and then converged by the second alignment mark with respect to the first direction, to determine the relative positional deviation between the first and second objects.

31. A method according to claim 30, wherein each of the first and second alignment marks comprises a zone plate.

32. A method according to claim 30, further comprising the steps of receiving the radiation beam from the first and second alignment marks with a sensor and determining the relative position of the first and second objects on the basis of the position of the received radiation beam on the sensor.

33. A method according to claim 32, wherein each of the first and second alignment marks comprises a zone plate.

34. A method according to claim 32, wherein said determining step comprises the step of determining the relative position of the first and second objects by use of a signal produced by the sensor.

35. A method according to claim 34, wherein each of the first and second alignment marks comprises a zone plate.

36. A method according to claim 34, wherein said providing step comprises the step of providing first and second objects with first and second alignment marks, respectively, the focal lengths of which are such that the radiation beam from the first and second alignment marks is substantially focused upon a light receiving surface of the sensor.

37. A method according to claim 36, wherein each of the first and second alignment marks comprises a zone plate.

38. A method according to claim 22, wherein said detecting step comprises the step of detecting the radiation beam diverged by the second alignment mark with respect to the first direction and then converged by the first alignment mark with respect to the first direction, to determine the relative positional deviation between the first and second objects.

39. A method according to claim 38, wherein each of the first and second alignment marks comprises a zone plate.

40. A method according to claim 38, further comprising the steps of receiving the radiation beam from the first and second alignment marks with a sensor and determining the relative position of the first and second objects on the basis of the position of the received radiation beam on the sensor.

41. A method according to claim 40, wherein each of the first and second alignment marks comprises a zone plate.

42. A method according to claim 40, wherein said determining step comprises the step of determining the relative position of the first and second objects by use of a signal produced by the sensor.

43. A method according to claim 42, wherein each of the first and second alignment marks comprises a zone plate.

44. A method according to claim 42, wherein said providing step comprises the step of providing first and second objects with first and second alignment marks, respectively, the focal lengths of which are such that the radiation beam from the first and second alignment marks is substantially focused upon a light receiving surface of the sensor.

45. A method according to claim 44, wherein each of the first and second alignment marks comprises a zone plate.

46. A method according to claim 22, wherein said detecting step comprises the step of detecting the radiation beam converged by the first alignment mark with respect to the first direction and then diverged by the second alignment mark with respect to the first direction, to determine the relative positional deviation between the first and second objects.

47. A method according to claim 46, wherein each of the first and second alignment marks comprises a zone plate.

48. A method according to claim 46, further comprising the steps of receiving the radiation beam from the first and second alignment marks with a sensor and determining the relative position of the first and second objects on the basis of the position of the received radiation beam on the sensor.

49. A method according to claim 48, wherein each of the first and second alignment marks comprises a zone plate.

50. A method according to claim 48, wherein said determining step comprises the step of determining the relative position of the first and second objects by use of a signal produced by the sensor.

51. A method according to claim 50, wherein each of the first and second alignment marks comprises a zone plate.

52. A method according to claim 50, wherein said providing step comprises the step of providing first and second objects with first and second alignment marks, respectively, the focal lengths of which are such that the radiation beam from the first and second alignment marks is substantially focused upon a light receiving surface of the sensor.

53. A method according to claim 52, wherein said of the first and second alignment marks comprises a zone plate.

54. A method according to claim 22, wherein said detecting step comprises the step of detecting the radiation beam converged by the second alignment mark with respect to the first direction and then diverged by the first alignment mark with respect to the first direction, to determine the relative positional deviation between the first and second objects.

55. A method according to claim 54, wherein each of the first and second alignment marks comprises a zone plate.

56. A method according to claim 54, further comprising the steps of receiving the radiation beam from the first and second alignment marks with a sensor and determining the relative position of the first and second objects on the basis of the position of the received radiation beam on the sensor.

57. A method according to claim 56, wherein each of the first and second alignment marks comprises a zone plate.

58. A method according to claim 56, wherein said determining step comprises the step of determining the relative position of the first and second objects by use of a signal produced by the sensor.

59. A method according to claim 58, wherein each of the first and second alignment marks comprises a zone plate.

60. A method according to claim 58, wherein said providing step comprises the step of providing first and second objects with first and second alignment marks, respectively, the focal lengths of which are such that the radiation beam from the first and second alignment marks is substantially focused upon a light receiving surface of the sensor.

61. A method according to claim 60, wherein each of the first and second alignment marks comprises a zone plate.

62. A method according to claim 14, wherein said second object providing step comprises the step of providing a second object having the second alignment mark having an infinite focal length with respect to the second direction.

63. A method according to claim 62, wherein each of the first and second alignment marks comprises a zone plate.

64. A method according to claim 62, further comprising the steps of receiving the radiation beam from the first and second alignment marks with a sensor and determining the relative position of the first and second objects on the basis of the position of the received radiation beam on the sensor.

65. A method according to claim 64, wherein each of the first and second alignment marks comprises a zone plate.

66. A method according to claim 64, wherein said determining step comprises the step of determining the relative position of the first and second objects by use of a signal produced by the sensor.

67. A method according to claim 66, wherein each of the first and second alignment marks comprises a zone plate.

68. A method according to claim 66, wherein said providing step comprises the step of providing first and second objects with first and second alignment marks, respectively, the focal lengths of which are such that the radiation beam from the first and second alignment marks is substantially focused upon a light receiving surface of the sensor.

69. A method according to claim 68, wherein each of the first and second alignment marks comprises a zone plate.

70. A method according to claim 62, wherein said detecting step comprises the step of detecting the radiation beam converged by the second alignment mark with respect to the first direction and then converged by the first alignment mark with respect to the first direction, to determine the relative positional deviation between the first and second objects.

71. A method according to claim 70, wherein each of the first and second alignment marks comprises a zone plate.

72. A method according to claim 70, further comprising the steps of receiving the radiation beam from the first and second alignment marks with a sensor and determining the relative position of the first and second objects on the basis of the position of the received radiation beam on the sensor.

73. A method according to claim 72, wherein each of the first and second alignment marks comprises a zone plate.

74. A method according to claim 72, wherein said determining step comprises the step of determining the relative position of the first and second objects by use of a signal produced by the sensor.

75. A method according to claim 74, wherein each of the first and second alignment marks comprises a zone plate.

76. A method according to claim 74, wherein said providing step comprises the step of providing first and second objects with first and second alignment marks, respectively, the focal lengths of which are such that the radiation beam from the first and second alignment marks is substantially focused upon a light receiving surface of the sensor.

77. A method according to claim 76, wherein each of the first and second alignment marks comprises a zone plate.

78. A method according to claim 62, wherein said detecting step comprises the step of detecting the radiation beam converged by the first alignment mark with respect to the first direction and then converged by the second alignment mark with respect to the first direction, to determine the relative positional deviation between the first and second objects.

79. A method according to claim 78, wherein each of the first and second alignment marks comprises a zone plate.

80. A method according to claim 78, further comprising the steps of receiving the radiation beam from the first and second alignment marks with a sensor and determining the relative position of the first and second objects on the basis of the position of the received radiation beam on the sensor.

81. A method according to claim 80, wherein each of the first and second alignment marks comprises a zone plate.

82. A method according to claim 80, wherein said determining step comprises the step of determining the relative position of the first and second objects by use of a signal produced by the sensor.

83. A method according to claim 82, wherein each of the first and second alignment marks comprises a zone plate.

84. A method according to claim 82, wherein said providing step comprises the step of providing first and second objects with first and second alignment marks, respectively, the focal lengths of which are such that the radiation beam from the first and second alignment marks is substantially focused upon a light receiving surface of the sensor.

85. A method according to claim 84, wherein each of the first and second alignment marks comprises a zone plate.

86. A method of detecting the spacing between first and second objects, said method comprising the steps of:

providing the first object with a pattern having different focal lengths with respect to a first direction and a second direction substantially perpendicular to the first direction, wherein the first and second directions are substantially parallel to the surface of the first object, and wherein the pattern further has a non-zero optical power with respect to each of the first and second directions;

supplying a radiation beam in a direction from the first object to the second object, the direction being inclined with respect to the surface of the second object, and directing a radiation beam reflected by the second object to a predetermined plane through the pattern of the first object; and determining the spacing between the first and second objects on the basis of the position of incidence of the reflected radiation beam on the predetermined plane with respect to the first direction;

wherein the focal length of the pattern of the first object with respect to the second direction is such that, with respect to the second direction, the reflected radiation beam is substantially focused upon the predetermined plane.

87. In a method of detecting the position of a substrate in a first direction, wherein the substrate is provided with a mark having a non-zero optical power in the first direction and also in a second direction perpendicular to the first direction, wherein the mark is illuminated whereby a light image is formed on a predetermined plane, and wherein the position of the substrate in the first direction is determined by detecting the position of the light image on the predetermined plane, the improvements comprising that:

the mark has first and second focal lengths in the first and second directions, respectively, which lengths are different from each other.

88. A method according to claim 87, wherein the mark has a zone plate pattern.

89. A method according to claim 88, wherein the substrate is a semiconductor wafer.

90. A position detecting system for detecting the position of a substrate, wherein the substrate is provided with a mark having a non-zero optical power in first and second orthogonal directions and having different focal lengths in the first and second directions, said system comprising:

illuminating means for illuminating the mark, whereby a light image is formed;

signal producing means having a light receiving surface, for receiving the light image and for producing a signal corresponding to the position of the light image on said light receiving surface; and detecting means for detecting the position of the substrate in the first direction on the basis of the produced signal.

91. A system according to claim 90, wherein the mark has a zone plate pattern.

92. A system according to claim 91, wherein the substrate is a semiconductor wafer.

93. A position detecting system for detecting the position of a first substrate relative to a second substrate, wherein the first and second substrates are provided with first and second marks, respectively, each having a non-zero optical power in a first direction and wherein at least one of the first and second marks of the first and second substrate also has a non-zero optical power with a focal length in a second direction, perpendicular to the first direction, which focal length is different from that in the first direction, said system comprising:

illuminating means for illuminating the first and second marks of the first and second substrates, whereby a light image is formed through the first and second marks;

signal producing means having a light receiving surface, for receiving the light image and for producing a signal corresponding to the position of the light image on said light receiving surface; and detecting means for detecting the position of the first substrate in the first direction on the basis of the produced signal.

94. A system according to claim 93, wherein each of the first and second marks has a zone plate pattern.

95. A system according to claim 94, wherein the first substrate is a mask and the second substrate is a semiconductor wafer.

96. A system according to claim 94, wherein each of the first and second marks of the first and second substrates has a non-zero optical power with a focal length in the second direction different from that in the first direction.

97. A system according to claim 94, wherein one of the first and second marks of the first and second substrates has a non-zero optical power with a focal length in the second direction different from that in the first direction, and wherein the other of the first and second marks has a zero optical power in the second direction.

98. A mask having an alignment mark with an optical power, wherein said mark has a non-zero optical power with respect to each of a first direction and a second direction which is substantially perpendicular to the first direction and wherein said mark has different focal lengths with respect to the first and second directions.

99. A mask according to claim 98, wherein said mark comprises a zone plate.

100. A wafer having an alignment mark with an optical power, wherein said mark has a non-zero optical power with respect to each of a first direction and a second direction which is substantially perpendicular to the first direction, and wherein said mark has different focal lengths with respect to the first and second directions.

101. A wafer according to claim 100, wherein said mark comprises a zone plate.

102. A method of manufacturing a microdevice by aligning first and second objects with each other and by transferring a pattern of one of the first and second objects to the other, said method comprising the steps of:

providing the first object with a first alignment mark having different focal lengths with respect to a first direction and a second direction substantially perpendicular to the first direction, the first alignment mark having a non-zero optical power with respect to each of the first and second directions;

providing the second object with a second alignment mark having a non-zero optical power with respect to the first direction;

supplying a radiation beam to each of the first and second alignment marks;

detecting any of the radiation beam from the first and second alignment marks to determine the relative positional deviation between the first and second objects with respect to the first direction; and aligning the first and second objects with each other on the basis of the relative positional deviation between the first and second objects.

103. A method according to claim 102, wherein each of the first and second alignment marks comprises a zone plate.

104. A microdevice manufactured by a method wherein first and second objects are brought into alignment with each other and wherein a pattern of one of the first and second objects to then transferred to the other, said method comprising the steps of:

providing the first object with a first alignment mark having different focal lengths with respect to a first direction, and a second direction substantially perpendicular to the first direction, the first alignment mark having a non-zero optical power with respect to each of the first and second directions;

providing the second object with a second alignment mark having a non-zero optical power with respect to the first direction;

supplying a radiation beam to each of the first and second alignment marks;

detecting any of the radiation beam from the first and second alignment marks to determine the relative positional deviation between the first and second objects with respect to the first direction; and aligning the first and second objects with each other on the basis of the relative positional deviation between the first and second objects.

105. A microdevice according to claim 104, wherein each of the first and second alignment marks comprises a zone plate.

106. A method used in manufacturing a microdevice comprising the steps of:

forming a pattern on a substrate;

providing the substrate with a mark having a non-zero optical power in the first direction and also in a second direction perpendicular to the first direction;

illuminating the mark whereby a light image is formed on a predetermined plane; and determining the position of the substrate in the first direction by detecting the position of the light image on the predetermined plane, wherein the mark has first and second focal lengths in the first and second directions, respectively, which lengths are difference from each other.

107. A method according to claim 106, wherein the mark has a zone plate pattern.

108. A method according to claim 106, wherein the substrate is a semiconductor wafer.

109. An exposure system for detecting the position of a substrate and for forming a pattern on the substrate through an exposure process, wherein the substrate is provided with a mark having a non-zero optical power in first and second orthogonal directions and having different focal lengths in the first and second directions, said system comprising:

illuminating means for illuminating the mark, whereby a light image is formed;

signal producing means having a light receiving surface, for receiving the light image and for producing a signal corresponding to the position of the light image on said light receiving surface; and detecting means for detecting the position of the substrate in the first direction on the basis of the produced signal.

110. A system according to claim 109, wherein the mark has a zone plate pattern.

* * * * *

UNITED STATES PATENT AND TRADEMARK OFFICE
CERTIFICATE OF CORRECTION

PATENT NO. : 5,294,980
DATED : March 15, 1994
INVENTOR(S) : MASAKAZU MATSUGU, ET AL.

It is certified that error appears in the above-indentified patent and that said Letters Patent is hereby corrected as shown below: Title page:

Item: [56] REFERENCES CITED

U.S. PATENT DOCUMENTS
"5,114,235   5/1995   Suda et al." should read
--5,114,235   5/1992   Suda et al.--.

FOREIGN PATENT DOCUMENTS
"0001504   2/1988   Japan" should read
--0001504   1/1990   Japan--.

COLUMN 4:
Line 23, "occasion," should read --case,--.

COLUMN 5:
Line 4, "The" should read --In--.

COLUMN 11:
Line 40, delete "a".

COLUMN 13:
Line 26, "has" should read --have--.

COLUMN 16:
Line 47, "where as" should read --whereas--.

COLUMN 17:
Line 52, "ably designed" should read --ably be designed--.

COLUMN 26:
Line 39, "at" should read --in--.

UNITED STATES PATENT AND TRADEMARK OFFICE
CERTIFICATE OF CORRECTION

PATENT NO. : 5,294,980
DATED : March 15, 1994
INVENTOR(S) : MASAKAZU MATSUGU, ET AL.

It is certified that error appears in the above-indentified patent and that said Letters Patent is hereby corrected as shown below:

COLUMN 28:
Line 20, "receiving" should read --received--.

COLUMN 30:
Line 13, "said of" should read --said each of--.

COLUMN 34:
Line 34, "to" (first occurrence) should read --is--.

COLUMN 35:
Line 3, "difference" should read --different--.

Signed and Sealed this

Twentieth Day of September, 1994

Attest:

BRUCE LEHMAN

*Attesting Officer*    *Commissioner of Patents and Trademarks*